US011251803B2

(12) United States Patent
Gupta et al.

(10) Patent No.: US 11,251,803 B2
(45) Date of Patent: Feb. 15, 2022

(54) NON-LINEARITY CORRECTION

(71) Applicant: TEXAS INSTRUMENTS INCORPORATED, Dallas, TX (US)

(72) Inventors: Pankaj Gupta, Rajasthan (IN);
Jawaharlal Tangudu, Bangalore (IN);
Ajai Paulose, Idukki (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/063,037

(22) Filed: Oct. 5, 2020

(65) Prior Publication Data

US 2021/0105019 A1 Apr. 8, 2021

(30) Foreign Application Priority Data

Oct. 3, 2019 (IN) .............................. 201941040030
Oct. 18, 2019 (IN) .............................. 201941042295
Nov. 28, 2019 (IN) .............................. 201941048813

(51) Int. Cl.
*H03M 1/06* (2006.01)
*H03M 1/10* (2006.01)
*H03M 3/00* (2006.01)
*H03M 1/12* (2006.01)

(52) U.S. Cl.
CPC ............... *H03M 1/10* (2013.01); *H03M 1/06* (2013.01); *H03M 1/12* (2013.01); *H03M 3/38* (2013.01)

(58) Field of Classification Search
CPC ............ H03M 1/06; H03M 1/10; H03M 3/38; H03M 1/12
USPC ................................. 341/118, 120, 155, 126
See application file for complete search history.

(56) References Cited

U.S. PATENT DOCUMENTS

| | | | |
|---|---|---|---|
| 6,449,110 B1 | 9/2002 | DeGroat et al. | |
| 7,012,772 B1 | 3/2006 | Vis | |
| 7,352,306 B2 | 4/2008 | Xu | |
| 8,427,175 B2 | 4/2013 | Kidambi | |
| 8,542,138 B2 | 9/2013 | Galton | |
| 9,219,493 B1 * | 12/2015 | Kunnen | H03M 3/496 |
| 9,503,112 B1 * | 11/2016 | Zanbaghi | H03M 1/1004 |
| 9,935,645 B1 | 3/2018 | Tangudu et al. | |
| 2006/0097108 A1 | 5/2006 | Liu et al. | |
| 2010/0194611 A1 | 8/2010 | Kibune | |
| 2011/0043392 A1 | 2/2011 | Anthony | |
| 2017/0324421 A1 | 11/2017 | Tangudu | |
| 2020/0169279 A1 | 5/2020 | Gunturi et al. | |

(Continued)

OTHER PUBLICATIONS

PCT Search & Written Report dated Feb. 11, 2021.

*Primary Examiner* — Joseph J Lauture
(74) *Attorney, Agent, or Firm* — Valerie M. Davis; Charles A. Brill; Frank D. Cimino

(57) ABSTRACT

A method for non-linearity correction includes receiving a first output signal from a data signal path containing a first analog-to-digital converter and receiving a second output signal from a second analog-to-digital converter. The method also includes generating first non-linearity coefficients using the first output signal and generating second non-linearity coefficients using the first and second output signals. The method further includes applying, by a non-linearity corrector in the data signal path, the first and second non-linearity coefficients to compensate for non-linearity components in a digitized signal output from the first analog-to-digital converter to generate a corrected digitized signal.

24 Claims, 11 Drawing Sheets

(56) References Cited

U.S. PATENT DOCUMENTS

2021/0105019 A1  4/2021  Gupta et al.
2021/0105021 A1  4/2021  Tangudu et al.

\* cited by examiner

NON-LINEARITY CORRECTION

CROSS REFERENCE TO RELATED APPLICATIONS

This application claims priority to Indian Provisional Patent Application No. 201941040030, filed Oct. 3, 2019, entitled "A LOW-SNR REFERENCE ADC AIDED NON-LINEARITY ESTIMATION IN PRESENCE OF SOURCE NON-LINEARITY," Indian Provisional Patent Application No. 201941042295, filed Oct. 18, 2019, entitled "FREQUENCY DOMAIN ESTIMATION OF COEFFICIENTS OF A MULTI-TAP VOLTERRA AND DERIVATIVE BASED NON LINEARITY CORRECTOR," and Indian Provisional Patent Application No. 201941048813 filed Nov. 28, 2019, entitled "A COUPLED ESTIMATION OF SECOND AND THIRD ORDER NON-LINEARITY COEFFICIENTS IN PRESENCE OF BOARD DEPENDENT HD2," each of which is incorporated herein by reference in its entirety.

TECHNICAL FIELD

This relates generally to non-linearity correction and, more particularly, to generating non-linearity correction coefficients and performing non-linearity correction within a system.

BACKGROUND

An electronic system, such as a mobile phone, audio and video equipment, a wireline communication system, measurement equipment, a radar system, etc., may include one or more non-linear circuits or components, which may adversely impact performance of the system. One such non-linear circuit is an analog-to-digital converter ("ADC"), which converts a continuous time analog signal (e.g., a voltage or current) into a discrete time representation (a digital or digitized signal) that is proportional in magnitude to the continuous time signal. However, there may be other sources of non-linearity within the system, such as from circuitry on a printed circuit board ("PCB" or "board), for instance at a user end, upon which the ADC is mounted. There may also be "source non-linearity" caused by components of a transmitter of the continuous time signal. A non-linearity corrector may be used to compensate for non-linearity within a system.

SUMMARY

As technology advances, some non-linearity correction methodologies may not enable the meeting of target performance specifications. For example, the wireless infrastructure ("WI") market is moving towards a radio frequency-ADC ("RF-ADC") based sampling architecture due to its ease of supporting multiple frequency bands and wider bandwidth with reduced board space. As such, key care-about includes RF-ADC non-linearity performance metrics such as second and third order harmonic distortion and second and third order intermodulation distortion. An example target spurious-free dynamic range ("SFDR") specification is −80 dBFS across various receiver operating scenarios, such as across various input levels, Nyquist zones (frequencies), and temperature ranges (e.g., −40 C to 125 C). However, a target SFDR of −80 dBFS is challenging when the non-corrected ADC output signal level is −55 dBFS, which occurs in some applications.

Additionally, there may be non-linearity caused by board circuitry at the user end (for instance second order non-linearity) and non-linearity due to temperature, voltage variations, and/or aging effects, which, if not corrected, makes it difficult to meet target performance specifications. Moreover, it is desired that non-linearity caused by the ADC (and other circuitry residing on a chip with the ADC, for instance) and non-linearity caused by board circuitry and other effects within the system, is corrected without correcting source non-linearity. For example, source non-linearity may be caused by RF power amplifier and digital pre-distortion circuitry of a transmitter.

One solution to correct or compensate for non-linearity in a system is applying factory-calibrated non-linearity correction to a digital signal output from an ADC. Namely, at production, non-linearity correction coefficients are determined for a range of sampling rates, Nyquist zones, and digital step attenuator (DSA) indexes, and stored in memory. During run-time, appropriate non-linearity correction coefficients are programmed into a non-linearity corrector, from memory, based on receiver configuration. However, this approach has some limitations. For example, the time needed to perform the in-factory calibration and the memory needed to store the coefficients increases device cost. Also, other non-linearity sources, such as second order non-linearity caused by the board on which the ADC is mounted, and changes due to temperature, voltage, and/or aging are not accounted for by factory calibration.

Disclosed examples of non-linearity correction address these limitations. In accordance with one or more examples of the disclosure, a digital signal output from a data signal path containing board circuitry, a main (e.g., first) ADC, and a non-linearity corrector is used to determine or generate (e.g., by estimation) some of the non-linearity correction coefficients that the non-linearity corrector uses to correct a digital signal output from the main ADC. For example, the digital signal output from the data signal path is used to determine the non-linearity correction coefficients used to correct second order non-linearity, for instance caused by the main ADC (and circuitry co-located with the main ADC) and caused by the board circuitry. Further, digital signals output from both the data signal path and from a reference path containing a reference (e.g., second) ADC are used to estimate the remainder of the non-linearity correction coefficients used by the non-linearity corrector. For example, the reference path is used to subtract out a signal containing source non-linearity and the second order non-linearity caused by the board circuitry in order to determine the non-linearity correction coefficients used to correct third order non-linearity, for instance caused by the main ADC (and circuitry co-located with the main ADC).

In this manner, disclosed examples may be implemented at run-time to compensate or correct for non-linearity caused by circuitry in the data signal path, without correcting or compensating for source non-linearity. Also, disclosed examples may be implemented at periodic intervals of time to correct or compensation for changes in non-linearity performance due to temperature, voltage, and/or aging. Additionally, since non-linearity correction coefficients are determined at run-time, the cost of a system implementing one or more examples described herein can be reduced by eliminating in-factory calibration and non-volatile storage of the correction coefficients.

In one example, a method for non-linearity correction includes receiving a first output signal from a data signal path containing a first analog-to-digital converter and receiving a second output signal from a second analog-to-digital converter. The method also includes generating first non-linearity coefficients using the first output signal and generating second non-linearity coefficients using the first and second output signals. The method further includes applying, by a non-linearity corrector in the data signal path, the first and second non-linearity coefficients to compensate for non-linearity components in a digitized signal output from the first analog-to-digital converter to generate a corrected digitized signal.

In another example, a system includes a non-linearity coefficient generator and a non-linearity corrector coupled to the non-linearity coefficient generator. The non-linearity coefficient generator is configured to process a first digitized signal to generate second order non-linearity coefficients and process the first digitized signal and a second digitized signal to generate third order non-linearity coefficients. The non-linearity corrector is configured to correct non-linearity components in a digitized signal output from an analog-to-digital converter, using the second and third order non-linearity coefficients, to generate a corrected digitized signal.

In another example, a system includes a digital signal path, a reference path, and a non-linearity coefficient generator. The digital signal path includes a first analog-to-digital converter (ADC) having a first ADC input and a first ADC output and a non-linearity corrector having a first non-linearity corrector input coupled to the first ADC output and having a second non-linearity corrector input. The reference path includes a second ADC having a second ADC input and a second ADC output. The non-linearity coefficient generator has a first input coupled to the data signal path, a second input coupled to the second ADC output, and an output coupled to the second non-linearity corrector input. The non-linearity coefficient generator is configured to: receive a first digitized signal from the data signal path; receive a second digitized signal from the second ADC; generate second order non-linearity coefficients using the first digitized signal; generating third order non-linearity coefficients using the first and second digitized signals; and provide the second and third order non-linearity coefficients to the non-linearity corrector.

DETAILED DESCRIPTION

Figure 1:
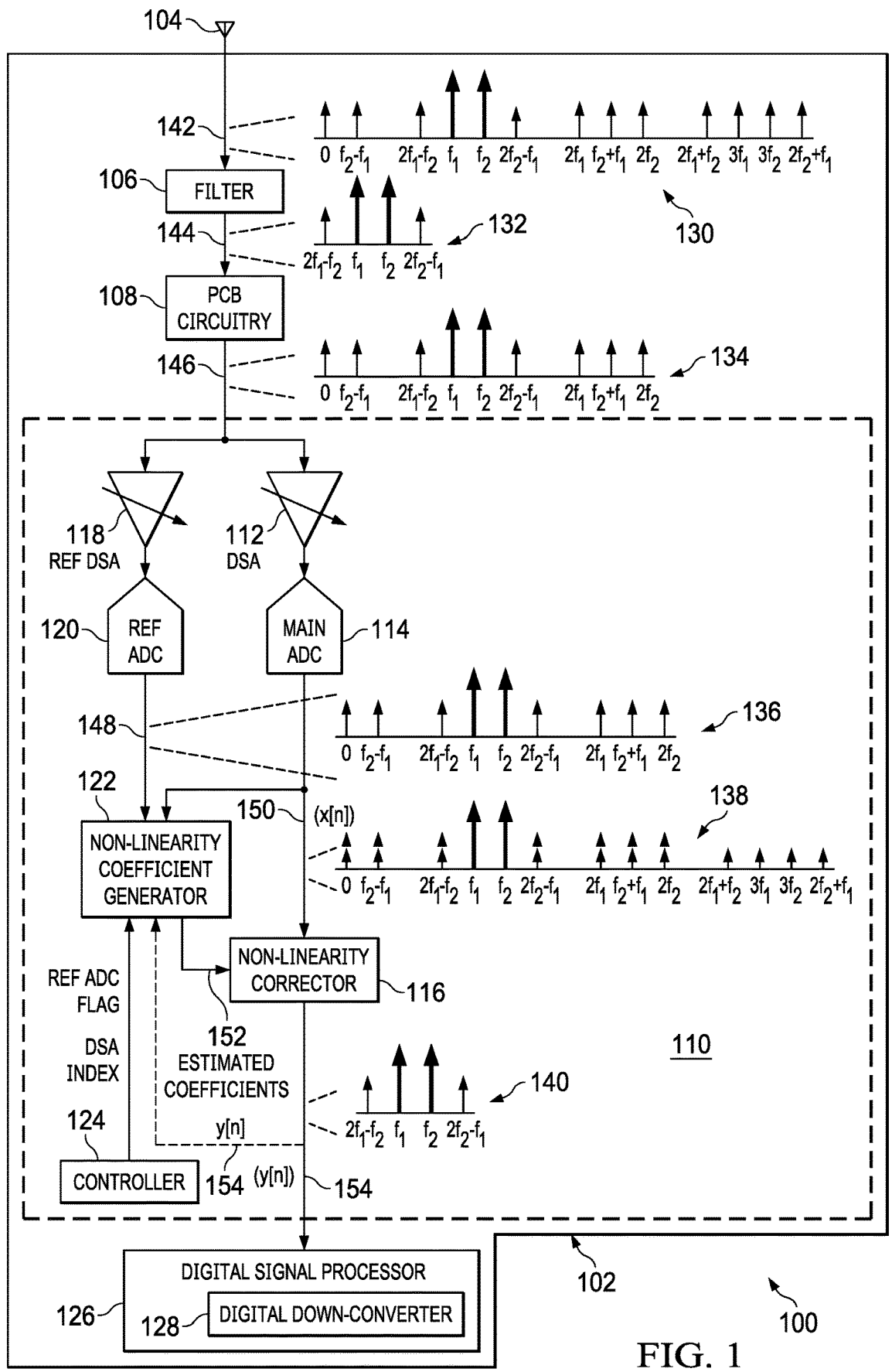
FIG. 1 depicts an example system including non-linearity correction circuitry in accordance with the present disclosure.

In the drawings, like reference numerals refer to like elements throughout, and the various features are not necessarily drawn to scale. In the description and in the claims, the terms "including" and "having" and variants thereof are intended to be inclusive in a manner similar to the term "comprising" unless otherwise noted. In addition, the terms "couple", "coupled" or "couples" means an indirect or direct electrical or mechanical connection.

Referring initially to FIG. 1, which depicts an example system 100 including non-linearity correction circuitry 116 and 122 in accordance with the present disclosure. In an example, the system 100 is included in receiver circuitry (e.g., as part of a transceiver) of a system such as a mobile phone, audio and video equipment, a wireline communication system, measurement equipment, a radar system, etc.

System 100 includes a PCB or board 102 and an antenna 104 attached to the board 102. The board 102 contains or has mounted thereon a filter 106, PCB or board circuitry 108, a (first) digital step attenuator (DSA) 112, a main (first) ADC 114, a non-linearity ("NL") corrector 116, a reference (second) DSA 118, a reference (second) ADC 120, a NL coefficient generator 122, a controller 124, and a digital signal processor ("DSP") 126, which includes a digital down-converter 128 and may include other circuitry (not shown). The circuitry mounted on the board 102 includes inputs and outputs coupled together as illustrated to allow processing of a data signal during run-time of the board 102. Spectral plots 130-140 are frequency domain representations of the data signal (labeled as 142-154) at various stages of processing within the system 100.

The filter 106, PCB circuitry 108, DSA 112, main ADC 114, and NL corrector 116 form what is referred to herein as a "data signal path" or "main path" through which a data signal received into the antenna 104 travels and is processed before being provided to the DSP 126 for further processing. The reference DSA 118 and reference ADC 120 form what is referred to herein as a "reference path." Also, in a particular example, the DSA 112, main ADC 114, NL corrector 116, reference DSA 118, reference ADC 120, NL coefficient generator 122, and controller 124 are co-located on a chip 110, which is mounted to the board 102. However, this need not be the case in other examples.

Moreover, the DSA 112, main ADC 114, reference DSA 118, and reference ADC 120 are implemented as circuitry in hardware. The NL coefficient generator 122 and/or the NL corrector 116 may be implemented as circuitry in hardware or firmware, or implemented by a processor executing instructions stored in memory, such as a microprocessor or microcontroller, which may be the same as or different from controller 124. The controller 124, for instance a microcontroller, controls the timing of digital processes performed by the NL coefficient generator 122 and the NL corrector 116. The controller 124 may also provide control signals, such as DSA indices or values or control flags to circuitry on the chip 110.

During operation, or run-time, an analog signal 142 containing data (also referred to interchangeably herein as an analog data signal or a source input signal) is received by the antenna 104. In this example, the received analog data signal 142 is a two-tone input signal at fundamental or carrier frequencies $f_1$ and $f_2$, as illustrated by spectral plot 130. Further, in this example, the received signal 142 is an RF signal, whereby $f_1$ and $f_2$ are within the radio spectrum. Also shown by spectral plot 130 is that the received signal 142 includes "source" non-linearity components, caused by non-linearity in circuitry of the transmitter, such as power amplifier and/or digital pre-distortion circuitry. In this example, the source non-linearity components include: second order non-linearity components at DC and at frequencies $f_2-f_1$, $2f_1$, $2f_2$, and $f_1+f_2$; "close-in" third order non-linearity components at frequencies $2f_1-f_2$ and $2f_2-f_1$, which are closer to the fundamental frequencies; and "far-off" third order non-linearity components at frequencies $2f_1+f_2$, $3f_1$, $3f_2$, $f_1+2F_2$, which are farther from the fundamental frequencies.

The received signal 142 passes through filter 106, which in an example is a band-select filter, which limits the bandwidth of the received signal 142. In this example, filter 106 filters off all the second order non-linearity components and far-off third order non-linearity components. Accordingly, an analog data signal 144 output from the filter 106, as illustrated by spectral plot 132, includes only the fundamental frequency components at $f_1$ and $f_2$ and close-in third order non-linearity components at $2f_1-f_2$ and $2f_2-f_1$ of the received signal 142.

Analog data signal 144 output from the filter 106 passes through PCB circuitry 108, which introduces second order non-linearity components at DC, $f_2-f_1$, $2f_2$, and $f_1+f_2$, as illustrated by spectral plot 134. The PCB circuitry 108 may include PCB traces, an interface between the PCB 102 and the chip 110, and/or other board impairments that introduce second order non-linearity into the data signal.

Both DSA 112 and reference DSA 118 receive an analog data signal 146 output from the PCB circuitry 108 for further processing through the main path and the reference path, respectively. Within the main path, the DSA 112 attenuates the analog data signal 146 by an attenuation value that is selectable by digital value provided to the DSA 112, for instance by the controller 124. The main ADC 114 (which in this example is a RF-ADC) digitizes the analog data signal 146 to generate a digital data signal 150 (x[n]), which is represented by the spectral plot 138. A digital data signal may also be referred to herein interchangeably as digital data, digitized data, or simply data. Similarly, within the reference path, the reference DSA 118 attenuates the analog data signal 146 by an attenuation value that is selectable by digital value provided to the reference DSA 118, for instance by the controller 124. The reference ADC 120 (which in this example is also a RF-ADC) digitizes the analog data signal 146 to generate a digital data signal 148, which is represented by the spectral plot 136.

Comparatively, the reference DSA 118 is more linear than the DSA 112, and the reference ADC 120 is more linear than the main ADC 114, and the reference components 118 and 120 may thus have an associated lower signal-to-noise ratio than the components 112 and 114. In a particular example, the reference DSA 118 and the reference ADC 120 are "highly linear" meaning that no additional second or third order non-linearity is introduced during signal processing, as shown by comparing the spectral plot 134 of the analog data signal 146 entering the reference path with the spectral plot 136 of the digital data signal 148 exiting the reference path.

By contrast, the processing performed by the DSA 112 and main ADC 114 introduces second order non-linearity components at DC, $f_2-f_1$, $2f_1$, $2f_2$, and $f_1+f_2$; close-in third order non-linearity components at $2f_1-f_2$ and $2f_2-f_1$; and far-off third order non-linearity components at $2f_1+f_2$, $3f_1$, $3f_2$, $f_1+2f_2$, as illustrated by spectral plot 138. The non-linearity correction circuitry, which includes the NL coefficient generator 122 and NL corrector 116, operates to correct, e.g., remove, mitigate, or compensate for, these non-linearity components in digital data signal 150. Accordingly, a digital data signal 154 (y[n], also referred to herein as non-linearity corrected data 154) output from the NL corrector 116 may have a spectral plot 140 similar to the spectral plot 132 of the analog data signal 144 exiting the filter 106.

Namely, the NL coefficient generator 122 generates (e.g., by estimation) non-linearity correction coefficients 152 for given sampling rates, Nyquist zones, DSA settings, etc., at which the main ADC 114 operates. The NL corrector 116 uses or applies the estimated non-linearity correction coefficients 152 to correct the non-linearity components in the digital data signal 150, which were caused by non-linearity of the PCB circuitry 108, the DSA 112, and the main ADC 114, without correcting the source non-linearity components.

By way of distinction, non-linearity correction coefficients are values estimated by a NL coefficient generator and used by a NL corrector to correct a digitized signal and, thereby generate a corrected digitized signal, also referred to herein as non-linearity corrected data. Non-linearity ("NL") correction coefficients are also interchangeably referred to herein as non-linearity coefficients, correction coefficients, coefficient values, and coefficients. By contrast, non-linearity terms are generated to model non-linearity components in a signal and, once generated, may be used by the NL coefficient generator to estimate the NL correction coefficients or used by the NL corrector to apply the estimated NL correction coefficients to correct the digitized signal. Also, non-linearity components are the spurious components within a signal at frequencies other than the fundamental frequencies.

The NL corrector 116 provides the non-linearity corrected data 154 to the DSP 126. In the DSP 126, the digital down-converter 128 down-converts the non-linearity corrected data 154 to provide down-converted in-phase and quadrature-phase data to downstream circuitry (not shown) for further processing, for instance for video and/or audio output. For example, the digital down-converter 128 multiples the non-linearity corrected data 154 by sine and cosine signals of a local oscillator to generate the down-converted data.

In an example, the non-linearity components of the digital data signal 150 (x[n]) output from the main ADC 114 are modeled by applying a multi-tap Voltera model and a derivative term based model to the raw output samples of the ADC 114. For instance, the non-linearity components of x[n] may be modeled using non-linearity terms, such as:

second order terms: $x^2[n]$, $x[n]x'[n]$, $x'^2[n]$
third order terms: $x^3[n]$, $x^2[n]x'[n]$, $x[n]x'^2[n]$, $x'^3[n]$, $x^2[n]x[n+1]$ or higher order non-linearity terms.

Figure 2:
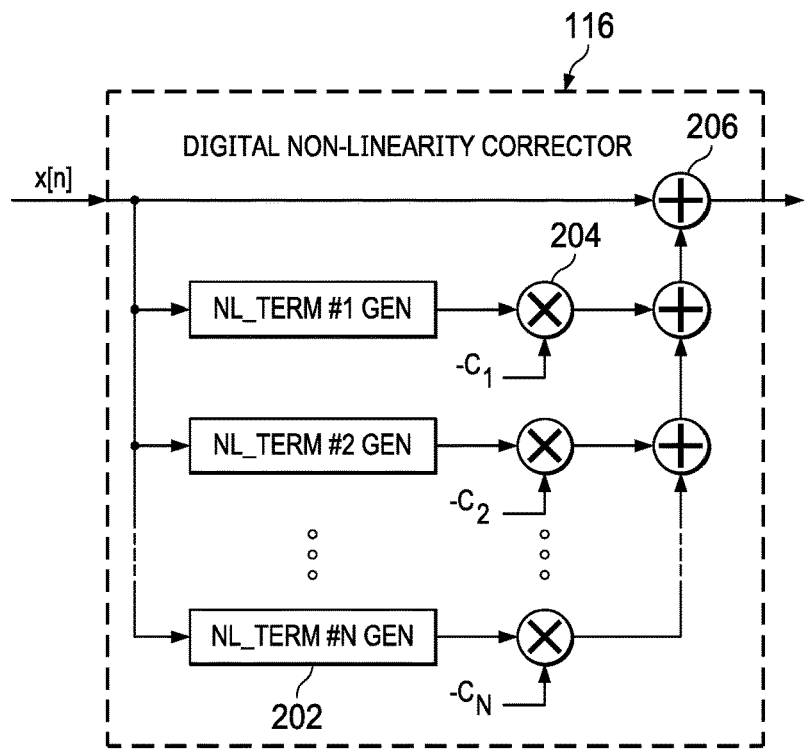
FIG. 2 depicts an example non-linearity corrector, which may be implemented in the system shown in FIG. 1.

FIG. 2 depicts an example non-linearity corrector 116, which may be implemented in the system 100 shown in FIG. 1. NL corrector 116 includes N number of non-linearity term generators 202, multipliers 204, and adders 206, with only one of each being labeled. Components 202-206 of the NL corrector 116 may be implemented as circuitry in hardware or firmware, or implemented by a processor executing instructions stored in memory, such as a microprocessor or microcontroller, which may be the same as or different from controller 124.

The non-linearity term generators 202 produce the various non-linearity terms corresponding to x[n], such as the second and third order non-linearity terms shown above, for use in non-linearity correction. The coefficient values ($C_1 \ldots C_N$) 152, also referred to herein as non-linearity correction coefficients, are estimated and provided by the NL coefficient generator 122 to NL corrector 116 for use in the non-linearity correction. The values of the NL correction coefficients 152 may vary with different instances of the DSA 112, the main ADC 114, and temperature, for instance.

The multipliers 204 of the NL corrector 116 scale the non-linearity terms by the coefficient values. The adders 206 of the NL corrector 116 combine the scaled non-linearity terms with the digital data signal 150 to generate the non-linearity corrected data 154. A NL correction coefficient (value) that is to be applied to, e.g., used to scale, a second order NL term in the NL corrector is referred to herein as a "second order NL correction coefficient." Similarly, a NL correction coefficient (value) that is to be applied to, e.g., used to scale, a third order NL term in the NL corrector is referred to herein as a "third order NL correction coefficient," and so on.

Figure 3:
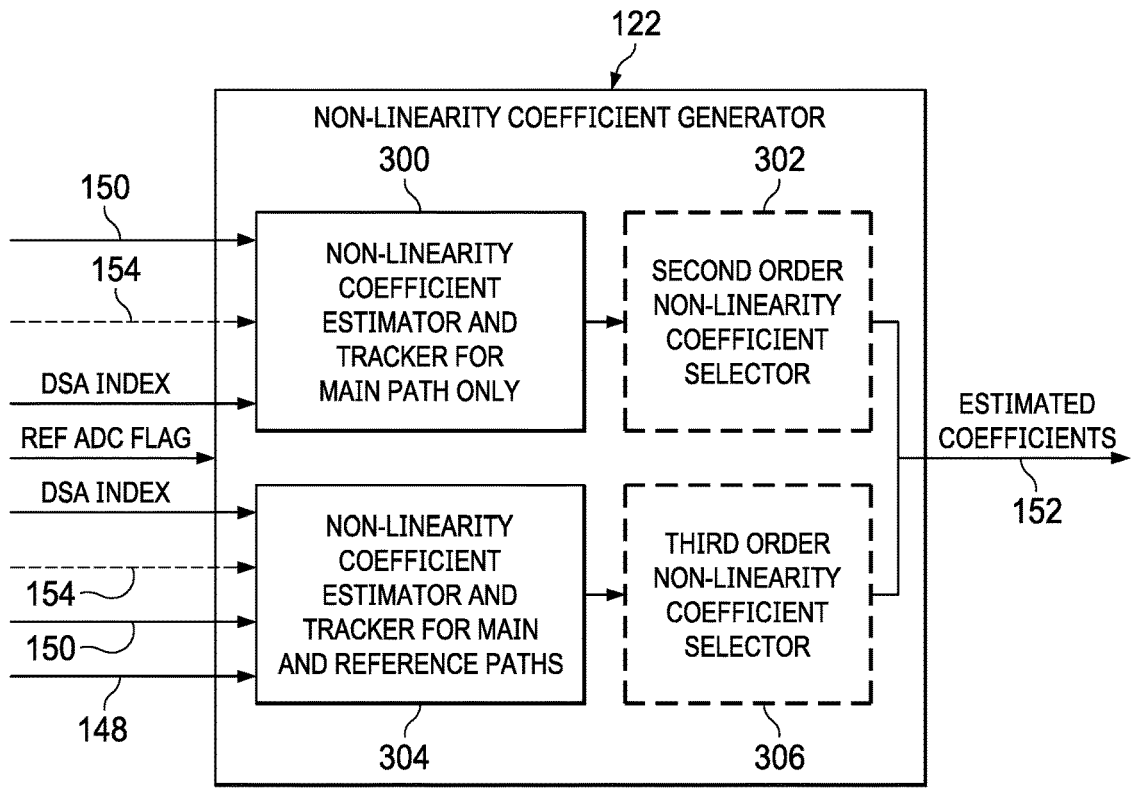
FIG. 3 depicts an example non-linearity coefficient generator, which may be implemented in the system shown in FIG. 1.

FIG. 3 depicts an example NL coefficient generator 122, which may be implemented in the system 100 shown in FIG. 1. As illustrated, the NL coefficient generator 122 includes a NL coefficient estimator and tracker 300 and a NL coefficient estimator and tracker 304. In an example implementation, the NL coefficient generator 122 also includes a second order NL coefficient selector 302 (which may be incorporated into block 300) and a third order NL coefficient selector 306 (which may be incorporated into block 304). Selectors 302 and 306 may be used to address aliasing of non-linearity components within the data signal.

Components 300-306 of the NL coefficient generator 122 may be implemented as circuitry in hardware or firmware, or implemented by a processor executing instructions stored in memory, such as a microprocessor or microcontroller, which may be the same as or different from controller 124. Also, in one example, NL coefficient estimator and tracker 300 and NL coefficient estimator and tracker 304 are implemented using separate circuitry, as represented by the separate blocks 300 and 304. For example, NL coefficient estimator and tracker 300 is implemented using circuitry shown in and described below by reference to FIGS. 7-8, and NL coefficient estimator and tracker 304 is implemented using the circuitry shown in and described below by reference to FIGS. 11-13. However, in another example implementation, all or a portion of NL coefficient estimator and tracker 300 and NL coefficient estimator and tracker 304 is implemented using shared circuitry. However, in a particular example, filters such as Kalman filters used in NL coefficient estimator and tracker 300 and NL coefficient estimator and tracker 304 are separate even where other circuitry is shared.

In general, NL coefficient estimator and tracker 300 processes a data signal output from the main path only (either the signal 150 or 154) to generate some of the NL correction coefficients, which is also referred to herein as "blind non-linearity estimation." For example, the NL coefficient estimator and tracker 300 processes the main path data signal to provide only second order NL correction coefficients for correcting second order non-linearity components in the output signal from the main ADC 114. The close-in third order source NL components remaining in the signal 150 are not affected by applying the second order NL correction coefficients.

In one example, the NL coefficient estimator and tracker 300 only estimates the second order NL correction coefficients. In another example, the NL coefficient estimator and tracker 300 estimates both the second and third order NL correction coefficients and selects the second order NL correction coefficients there from using the selector 302. In this example, the estimator also maintains a measure of decoupling of the estimates of second order and third order coefficients. The second order estimated coefficients are selected based on a decoupling measure. If the measure indicates that there is a sufficient decoupling between the estimates of second and third order coefficients, then, the second order estimated coefficients are picked.

As previously mentioned, NL coefficient estimator and tracker 300 may be implemented using circuitry shown in and described below by reference to FIGS. 7-8. As later described in further detail, the non-linearity correction circuitry includes a non-linearity coefficient estimation and tracking circuit that captures data at either the input or output of the non-linearity corrector 116, generates non-linearity terms based on the captured data, and converts the captured data and the non-linearity terms from time domain to frequency domain. Frequency bins having a low level of signal (determined based on a first threshold) and a high level of non-linearity terms (determined based on a second threshold) are selected for use in non-linearity correction coefficient estimation. If the output of the non-linearity corrector 116 was captured, then the response of the captured data is converted from residual non-linearity to full non-linearity. Non-linearity correction coefficients are estimated based on the non-linearity terms and captured data for the selected frequency bins.

In general, NL coefficient estimator and tracker 304 processes a data signal output from the main path (either the signal 150 or 154) and the data signal 148 output from the reference path to generate some of the NL correction coefficients, which is also referred to herein as "referenced based non-linearity estimation." The main path is also referred to herein interchangeably as the main data path. The reference path is also referred to herein interchangeably as the reference data path. For example, the NL coefficient estimator and tracker 304 processes the main and reference path data signals to provide only third order NL correction coefficients for correcting third order non-linearity components in the output signal from the main ADC 114. The close-in third order source NL components remaining in the signal 150 are not affected by applying the third order NL correction coefficients since the reference path is used to subtract these components from the NL coefficient estimation.

In one example, the NL coefficient estimator and tracker 304 only estimates the third order NL correction coefficients. In another example, the NL coefficient estimator and tracker 304 estimates both the second and third order NL correction coefficients and selects the third order NL correction coefficients there from using the selector 306. In this example, the estimator also maintains a measure of the decoupling of estimates of second order and third order coefficients. The third order estimated coefficients are selected based on a decoupling measure. If the measure indicates theta there is a sufficient decoupling between the estimates of second and third order coefficients, then, the third order estimated coefficients are picked.

As previously mentioned, NL coefficient estimator and tracker 304 may be implemented using circuitry shown in and described below by reference to FIGS. 11-13. As later described in further detail, the non-linearity correction circuitry includes a main data path and a reference data path. An input signal is digitized in each of the data paths and converted from time domain to frequency domain. A channel estimate is computed for the reference data path with respect to the main data path, and the channel estimate is applied to equalize the reference data path. Equalized reference data path data is subtracted from the main data path data, and the difference is provided to the non-linearity coefficient estimation circuit along with the main data path ADC output for use in generating non-linearity correction coefficients. In this example, the reference path facilitates subtraction of digital step attenuator input (including source non-linearity components and second order non-linearity components caused by the PCB circuitry or even input signal) from the signal 150 output from the main ADC 114.

As further mentioned, there are some use-case scenarios when the second order non-linearity components can alias and fall back close to (or on top of) third order non-linearity components or vice-versa. In such scenarios, either or both of the blind NL estimation or the referenced based NL estimation could become slower to converge or biased. The selectors 302 and 306 may be used to address aliasing.

In an example, the NL coefficient generator 122 could be running in the background, where performance of the blind NL estimation (block 300) and the referenced based NL estimation (block 304) is interleaved. Accordingly, one estimation method is performed during one interval or cycle of time, and the other estimation method is performed during the next interval or cycle of time. In a particular example, the NL coefficient generator 122 switches between the two estimation methods every 100 milliseconds. However, depending on how quickly the estimation methods converge relative to each other, one estimation method may be performed for a longer interval of time than the other estimation method.

For example, during both estimation methods, both second and third order NL terms are generated. Additionally, both second and third order NL correction coefficients are tracked, along with their uncertainties or qualities (for example, using a multi-state Kalman filter). Moreover, when statistical-based filters (such as multi-state Kalman filters) are used in the NL coefficient estimations, current data may be weighted using previous or historical data to improve the NL coefficient estimations. For example, both the estimation modes have independent Kalman filters to estimate and track the coefficients. Kalman filter based implementation also tracks the quality of the estimates using a state error covariance matrix. This state error covariance matrix data may be used to determine the decoupling between the estimated coefficients. If the error covariance matrix indicates that the covariance between any second order coefficient estimate and any third order coefficient estimate is lower than a configured threshold, then, they are decoupled.

During blind NL estimation, second order NL coefficients are selected (block 302) based on the error covariance of the estimates of the second order NL coefficients with the third order NL coefficients. Similarly, during reference based NL estimation, third order NL coefficients are selected (block 306) based on the error covariance of the estimates of the third order NL coefficients with the second order NL coefficients. The NL coefficient estimations may be deemed reliable and, thereby, selected and provided to the NL corrector 116 when the error covariance, e.g., the covariance correlation in decibels (dB), falls below a programmable threshold.

Figure 4:
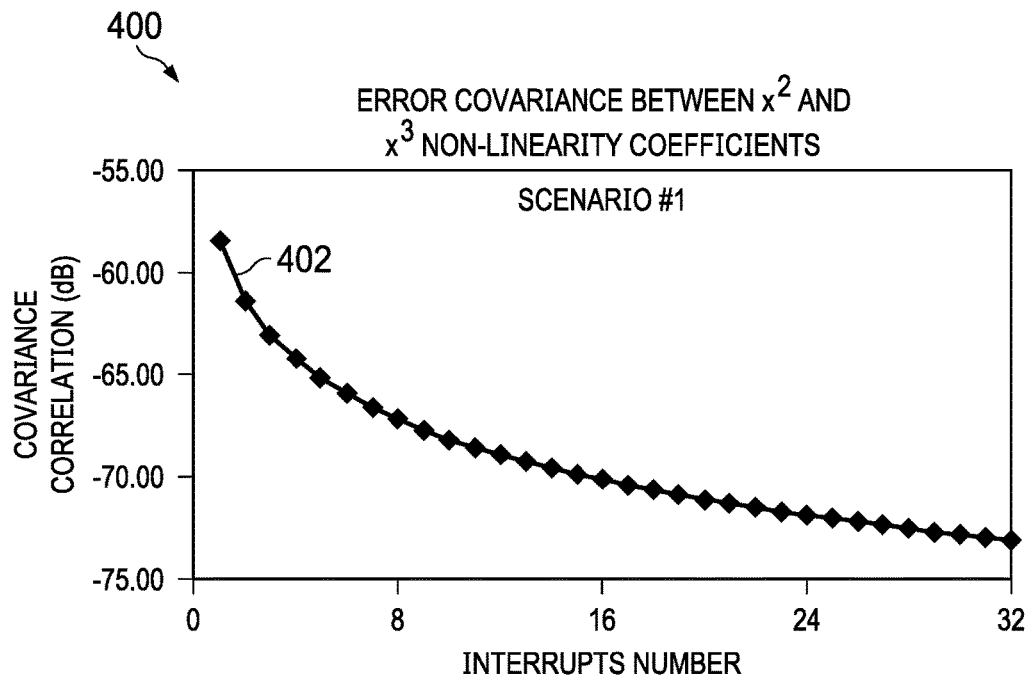
FIG. 4 depicts a diagram illustrating example simulation results for error covariance between non-linearity coefficients generated in the non-linearity coefficient generator shown in FIG. 3.

FIG. 4 depicts a diagram 400 illustrating example simulation results for error covariance between second and third order non-linearity coefficients generated in the non-linearity coefficient generator 122 shown in FIG. 3. Diagram 400 illustrates a plot 402 of covariance correlation in dB over a number of interrupts during which the covariance value is calculated.

In this first scenario, the ADC 114 sampling rate ($F_s$) is 256. A single tone is fed at (frequency) bin #51 (approximately $F_s/5$), and frequency bins 102 and 103 are used for non-linearity coefficient estimation. In this case, the 2F second order non-linearity component will fall into bin 102. The 3F third order non-linearity coefficient will fall into bin 153 and alias back to bin 103 ($F_s-3F=256-153$). Since there is a one bin gap, the NL coefficient estimations converge over time (e.g., after about 30 seconds), as shown by the covariance correlation decreasing. Once the covariance value is at an acceptable level (e.g., −70 dB), the NL coefficient generator 122 can resume providing the NL correction coefficients to the NL corrector 116.

Figure 5:
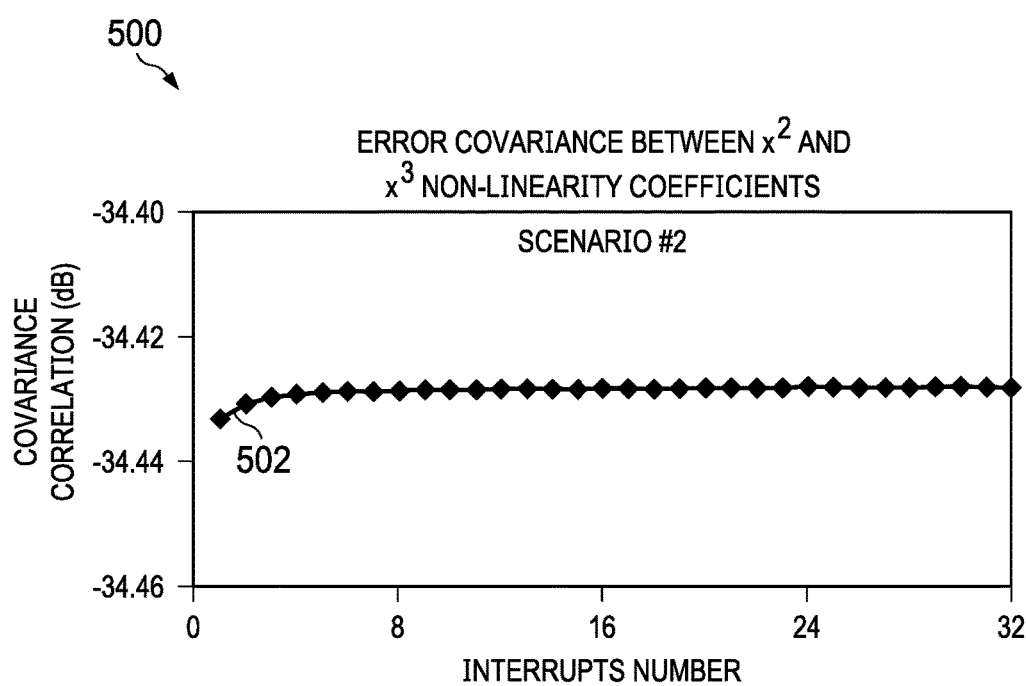
FIG. 5 depicts another diagram illustrating example simulation results for error covariance between non-linearity coefficients generated in the non-linearity coefficient generator shown in FIG. 3.

FIG. 5 depicts another diagram 500 illustrating example simulation results for error covariance between second and third order non-linearity term coefficients generated in the non-linearity coefficient generator 122 shown in FIG. 3. Diagram 500 illustrates a plot 502 of covariance correlation in dB over a number of interrupts during which the covariance value is calculated.

In this second scenario, the ADC 114 sampling rate ($F_s$) is 256. A single tone is fed at bin #51.2 (exactly $F_s/5$), and frequency bins 102 and 103 are used for non-linearity coefficient estimation. In this case, the 3F third order non-linearity component aliases back on top of the 2F second order non-linearity component. When this occurs, the NL coefficient estimations don't converge, as shown by the covariance correlation staying steady over time. Accordingly, the NL coefficient generator 122 can cease providing the NL correction coefficients to the NL corrector 116 until the covariance correlation is at an acceptable level.

Figure 6:
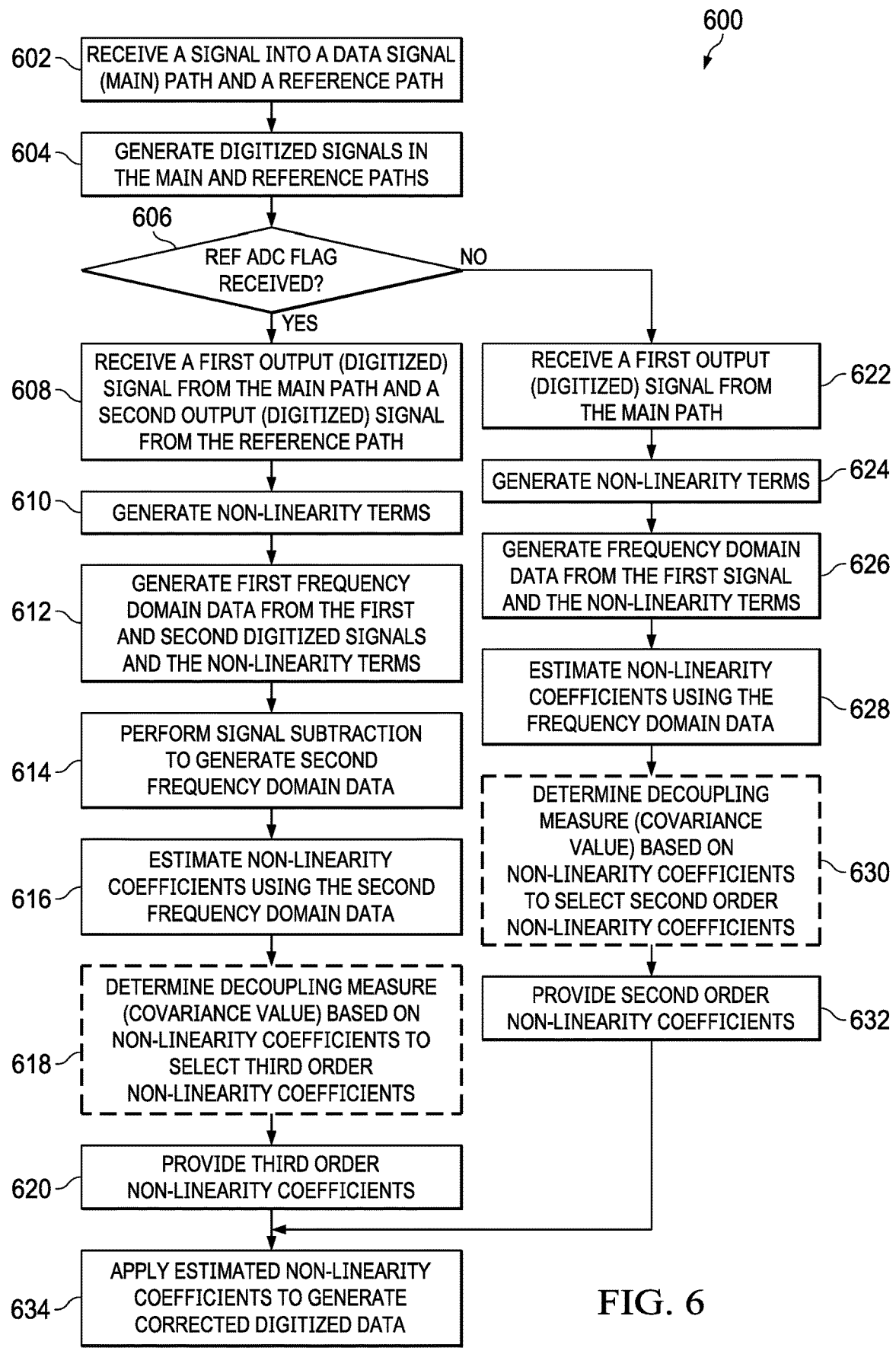
FIG. 6 depicts a flow diagram illustrating an example method for non-linearity correction, which may be performed by the non-linearity correction circuitry shown in FIGS. 1-3.

FIG. 6 depicts a flow diagram illustrating an example method 600 for non-linearity correction, which may be performed by the non-linearity correction circuitry shown in FIGS. 1-3. Though depicted sequentially as a matter of convenience, at least some of the actions shown can be performed in a different order and/or performed in parallel. Additionally, some implementations may perform only some of the actions shown.

In general, the circuitry receives a first output signal (e.g., signal 150 or 154) from a data signal path that includes a first ADC and a NL corrector and receives a second output signal from a second ADC. The circuitry generates first NL coefficients (e.g., second order NL coefficients) using the first output signal and generates second NL coefficients (e.g., third order NL coefficients) using the first and second output signals. The circuitry applies the first and second NL coefficients to compensate for NL components in a digitized signal output from the first ADC, to generate a corrected digitized signal.

More particularly, at block 602, a signal is received into a data signal (main) path and a reference path. For example, the signal 146 is received into the DSA 112 of the main path and into the DSA 118 of the reference path. At block 604, the ADC 112 in the main path and the ADC 120 in the reference path each digitizes the signal. At block 606, the NL coefficient generator 122 determines whether a reference ("REF") ADC flag was received from the controller 124.

If the REF ADC flag was received, at block 608 the NL coefficient estimator and tracker 304 (and in one implementation the third order NL coefficient selector 306) receives a first digitized signal from the main path (either the signal 150 or the signal 154) and a second digitized signal from the reference path (signal 148). NL coefficient estimator and tracker 304 (and selector 306 if used) processes the two digitized signals using blocks 610-620 to generate and provide third order NL coefficients to the NL corrector 116.

With reference to the processing, at block 610, the NL coefficient estimator and tracker 304 generates NL terms, either only third order NL terms if selector 306 is not used or both second order and third order NL terms if selector 306 is used. At block 612, the NL coefficient estimator and tracker 304 generates first frequency domain data from the first and second digitized signals and the NL terms.

At block 614, the NL coefficient estimator and tracker 304 performs a signal subtraction to generate second frequency domain data. For example, the frequency domain data for the signal 148 is subtracted from the frequency domain data for the signal 150 or 154. The resulting frequency domain data from the subtraction and the frequency domain data for the NL terms make up the second frequency domain data. The subtraction, at block 614, removes common input signal along with source non-linearity components and non-linearity components caused by the PCB circuitry 108.

At block 616, the NL coefficient estimator and tracker 304 estimates NL coefficients using the second frequency domain data. Where selector 306 is not used, only third order NL coefficients are estimated based on or using the third order NL terms. Otherwise, both second and third order NL coefficients are estimated based on or using the second and third order NL terms. At block 618, the selector 306 determines a decoupling measure, e.g., a first covariance value, based on the estimates of the second and third order NL coefficients, and selects the third order NL coefficients based on the first covariance value. The NL coefficient generator 122 provides the third order NL coefficients to the NL corrector 116, at block 620.

If the REF ADC flag was not received, at block 622 the NL coefficient estimator and tracker 300 (and in one implementation the second order NL coefficient selector 302) receives a only the digitized signal from the main path (either the signal 150 or the signal 154). NL coefficient estimator and tracker 300 (and selector 302 if used) processes the digitized signal using blocks 624-632 to generate and provide second order NL coefficients to the NL corrector 116.

With reference to the processing, at block 624, the NL coefficient estimator and tracker 300 generates NL terms, either only second order NL terms if selector 302 is not used or both second order and third order NL terms if selector 302 is used. At block 626, the NL coefficient estimator and tracker 300 generates frequency domain data from the received digitized signal and the NL terms.

At block 628, the NL coefficient estimator and tracker 300 estimates NL coefficients using the frequency domain data. Where selector 302 is not used, only second order NL coefficients are estimated based on or using the second order NL terms. Otherwise, both second and third order NL coefficients are estimated based on or using the second and third order NL terms. At block 630, the selector 302 determines a decoupling measure, e.g., a second covariance value, based on the estimates of the second and third order NL coefficients, and selects the second order NL coefficients based on the second covariance value. The NL coefficient generator 122 provides the second order NL coefficients to the NL corrector 116, at block 632.

At block 634, the NL corrector 116 receives the second and third order NL coefficients. The NL corrector 116 corrects non-linearity components in the signal 150 output from the main ADC 114, using the second and third order NL coefficients, to generate a corrected digitized signal 154. The second and third order NL coefficients are applied to compensate for the non-linearity components caused by circuitry in the data signal path without compensating for the source non-linearity components. More particularly, second order NL coefficients are applied to compensate for second order non-linearity components caused by the PCB circuitry 108, the DSA 112, and the ADC 114, and the third order NL coefficients are applied to compensate for third order non-linearity components caused by the DSA 112 and the ADC 114.

Figure 7:
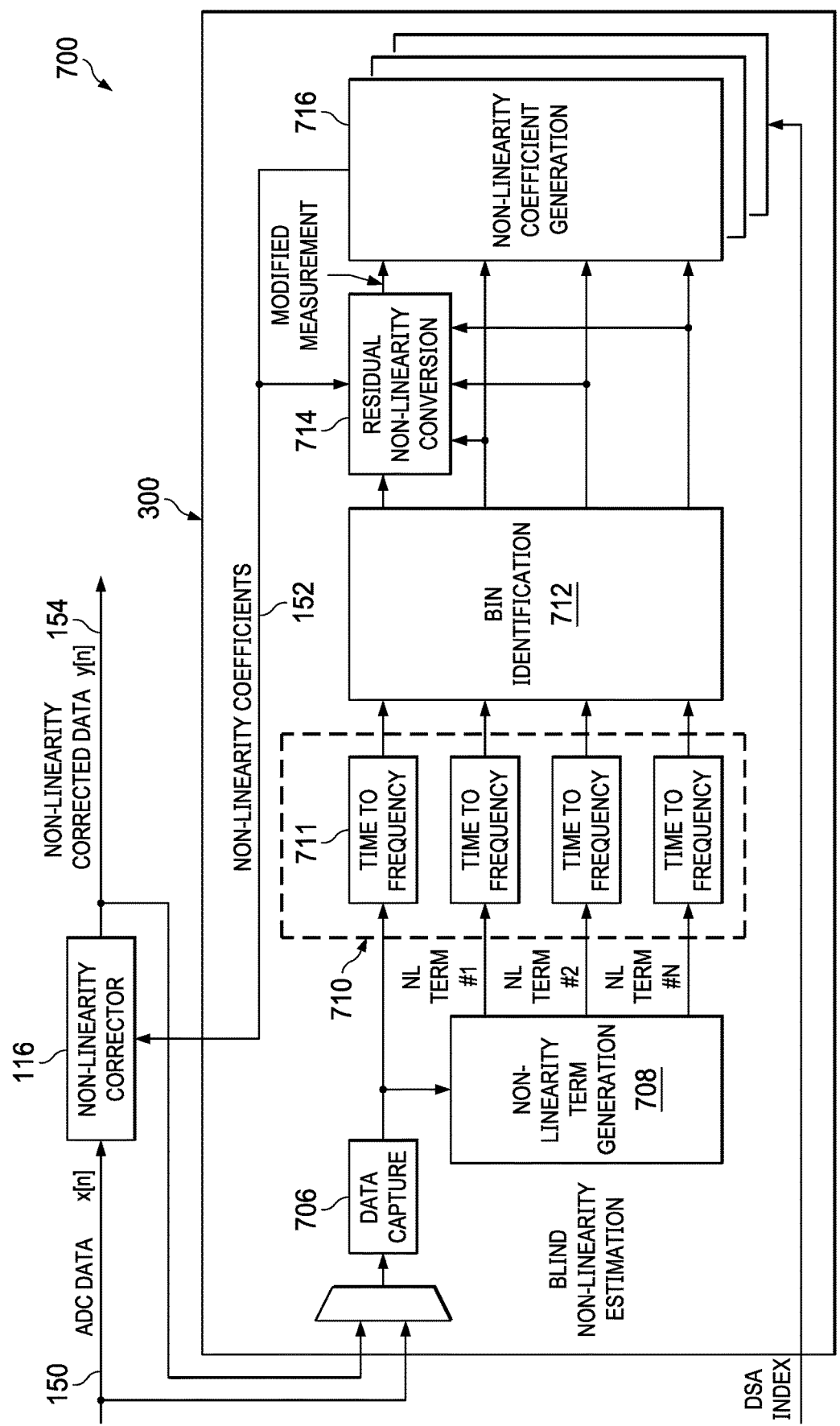
FIG. 7 depicts example non-linearity correction circuitry that estimates non-linearity correction coefficients using a digital signal output from the data signal (main) path alone, to facilitate non-linearity correction, which may be implemented in the non-linearity correction circuitry shown in FIGS. 1 and 3.

FIG. 7 depicts non-linearity correction circuitry 700 that includes the NL corrector 116 and an example NL coefficient estimator and tracker 300 that processes a digital signal output from the main path alone, to facilitate non-linearity correction, which may be implemented in the non-linearity correction circuitry shown in FIGS. 1 and 3. In one example, the digital signal output from the main path and processed by the NL coefficient estimator and tracker 300 is the signal 150 output from the main ADC 114. In another example, the digital signal output from the main path and processed by the NL coefficient estimator and tracker 300 is the signal 154 output from the NL corrector 116. The NL coefficient estimator and tracker 300 generates non-linearity correction coefficients, for use by the non-linearity corrector 116, at run-time during normal operation of the non-linearity corrector 116.

The NL coefficient estimator and tracker 300 includes a data capture circuit 706, a non-linearity term generation circuit 708, a time-to-frequency conversion circuit 710, a bin identification circuit 712, a residual non-linearity conversion circuit 714, and a non-linearity coefficient generation circuit 716. The data capture circuit 706 is coupled to the input of the non-linearity corrector 116 and to the output of the non-linearity corrector 116 to selectably capture raw data samples of the digital signal 150 or samples of the non-linearity corrected data 154 for use in generating non-linearity correction coefficients.

The data capture circuit 706 is coupled to the non-linearity term generation circuit 708 and the time-to-frequency conversion circuit 710. The non-linearity term generation circuit 708 receives captured data from the data capture circuit 706 and processes the data to generate non-linearity terms. For example a set of 256+k samples are captured from x[n] and from the captured samples different NL terms such as $x^3[n]$, $x^2[n]x'[n]$, $x^2[n]x[n+1]$, $(x'[n])^3$, or higher order NL terms, are generated. For each NL term, 256 samples are generated. However, an additional 'k' samples (to total 256+k) are captured at the input to generate a valid 256 samples for each NL term due to the memory effect in generating the digital derivative or other memory terms. In an example, the digital derivative is generated by an anti-symmetric finite impulse response (FIR) filter, or may be generated by other known means.

The non-linearity term generation circuit 708 is coupled to the time-to-frequency conversion circuit 710 and provides the non-linearity terms generated based on the data captured by the data capture circuit 706 to the time-to-frequency conversion circuit 710. The time-to-frequency conversion circuit 710 converts the data captured by the data capture circuit 706 and the non-linearity terms generated by the non-linearity term generation circuit 708 from time-domain to frequency-domain. For example, time-to-frequency blocks 711 (only one of four labeled) of the time-to-frequency conversion circuit 710 apply a fast Fourier transform ("FFT") to the captured data received from the data capture circuit 706 and the non-linearity terms generated by the non-linearity term generation circuit 708. In some implementations, the time-to-frequency conversion circuit 710 applies a FFT after multiplying the input data by a window function.

The time-to-frequency conversion circuit 710 is coupled to the bin identification circuit 712 and provides the frequency domain data derived from the data captured by the data capture circuit 706, and its non-linearity terms, to the bin identification circuit 712. The bin identification circuit 712 processes the frequency domain data to identify frequency bins to be used for generating the non-linearity correction coefficients. More specifically, the bin identification circuit 712 identifies frequency bins that have a high level of created non-linearity terms and a low level of input signal, e.g., as compared to respective thresholds, for use in generating the non-linearity correction coefficients.

The residual non-linearity conversion circuit 714 allows the non-linearity corrected data 154 produced by the non-linearity corrector 116 to be used as input to the non-linearity coefficient estimator and tracker 300, which provides a performance improvement for the second order effects arising from a large raw level of non-linearity. The residual non-linearity conversion circuit 714 modifies the frequency response of the non-linearity corrected data 154 by adding multiple correction terms to the frequency response of the non-linearity corrected data 154. Each correction term is a product of the frequency response of each non-linearity term with the corresponding correction coefficient value applied in the non-linearity corrector 116. The modification of the frequency response of the non-linearity corrected data 154 converts the non-linearity measurement from a "residual non-linearity measurement" to a "full non-linearity measurement."

The frequency bins identified by the bin identification circuit 712 and as modified by the residual non-linearity conversion circuit 714 are processed by the non-linearity coefficient generation circuit 716 to estimate and track non-linearity correction coefficients for each DSA range for use by the non-linearity corrector 116. The non-linearity coefficient generation circuit 716 generates the non-linearity correction coefficients for a current use configuration of the DSA 112 and the ADC 114. The non-linearity coefficient generation circuit 716 includes a multi-state Kalman filter to generate the non-linearity correction coefficients, in some example implementations. At the frequency bins selected by the bin identification circuit 712, the non-linearity terms responses serve as weights to the coefficients to be estimated, and the "full non-linear measurement" provided by the residual non-linearity conversion circuit 714 serves as a measurement as shown in matrix relation in equation (5) below.

With further regards to the estimation performed by the NL coefficient generation circuitry 716, assume that the digital non-linearity correction applied to the output signal 150 from ADC 114 is modeled using four terms as:

$$y[n]=x[n]+c_1 x^3[n]+c_2 x^2[n]x'[n]+c_3 x^2[n]+c_4 x[n]x'[n]+\text{noise} \quad (1)$$

where:
x[n] is the discretized output of the ADC 104 or analog circuit;
x'[n] is the effective derivative of x[n] (the output signal 150 from the ADC 114);
$c_i$ is the coefficient of each non-linearity term; and
y[n] is the output of the digital non-linearity corrector.

Equation (1) can be written in the frequency domain as:

$$F(y[n])=F(x[n])+c_1 F(x^3[n])+c_2 F(x^2[n]x'[n])+c_3 F(x^2[n])+c_4 F(x[n]x'[n])+\text{noise} \quad (2)$$

$$\Rightarrow c_1 F(x^3[n])+c_2 F(x^2[n]x'[n])+c_3 F(x^2[n])+c_4 F(x[n]x'[n])=F(y[n])-F(x[n])-F(\text{noise})$$

where equation (2) is valid for each frequency bin.

The left side of equation (2) represents the non-linearity introduced by the ADC 114 or an associated analog circuit. At frequency bins where there is no ADC input signal, the above equation (2) can be written as:

$$\Rightarrow c_1 F(x^3[n])+c_2 F(x^2[n]x'[n])+c_3 F(x^2[n])+c_4 F(x[n]x'[n])=-F(x[n])-F(\text{noise}) \quad (3)$$

Equation (3) can be used for estimating the non-linear coefficients $c_1$, $c_2$, $c_3$, and $c_4$. Also, the raw non-linearity levels are below about −55 dBFS. In practice all frequency bins whose signal level is lower than a threshold, e.g., −55 dBFS can be used for estimating the coefficients.

In the selected bins (selected by the bin identification circuit 712), the linear equation simplifies to:

$$\Rightarrow c_1 F(x^3[n])+c_2 F(x^2[n]x'[n])+c_3 F(x^2[n])+c_4 F(x[n]x'[n])=-F(x[n])-F(\text{noise}) \quad (4)$$

The non-linearity correction circuits identify multiple such linear equations and solves the equations to estimate all non-linearity term coefficients.

Namely, for each selected bin, there is one linear equation. For example, for $x^3[n]$ non-linearity (or any other third order nonlinearity or a combination of third order nonlinearity terms), each data block provides six equations for a two tone input. If there are 100 data capture blocks in one non-linearity estimation window, then 600 equations would be stored.

$$\begin{matrix} eq_1 \rightarrow \\ eq_2 \rightarrow \\ \vdots \\ eq_N \rightarrow \end{matrix} \begin{bmatrix} h_{1,1} & h_{1,2} & \ldots & h_{1,T} \\ h_{2,1} & h_{2,2} & \ldots & h_{2,T} \\ \vdots & \vdots & \ddots & \vdots \\ h_{N,1} & h_{N,2} & \ldots & h_{N,T} \end{bmatrix} c = \begin{bmatrix} m_1 \\ m_2 \\ \vdots \\ m_N \end{bmatrix} \Rightarrow Hc = m \quad (5)$$

where:
N is the number of equations, e.g., in equation (5);
T is the number of non-linear terms, example 1: For $x^3[n]$, $x^2 x'[n]$, T=2, example 2: For $x^3[n]$, $x^2[n]x'[n]$, $x^2[n]x[n+1]$, $(x'[n])^3$, T=4;
$h_{i,j}$ is the Fourier transform of the jth non-linearity (NL) term from the ith equation at the selected frequency bins from the selected capture set;

c is a T×1 vector of NL term coefficients to be estimated; and $m_i$ is the measurement of the ith equation which is the Fourier transform of the ADC output x[n] at the selected frequency bins from the selected capture set.

Such a system of linear equations (Hc=m) is solved (e.g., using a least squares or Kalman filter based technique) to estimate and track the non-linearity coefficients.

Some implementations of the non-linearity correction circuits allow non-linearity corrected data to be used as input for non-linearity coefficient estimation. If the coefficient estimator input is taken from the input of the non-linearity corrector, the non-linearity estimator sees the entire non-linearity of output from the ADC 114. However, if the coefficient estimator input is taken from the output of the non-linearity corrector 116, then the non-linearity estimator only sees residual non-linearity that is left over after non-linearity correction.

$$H\Delta c = m \rightarrow H(c - c_{corr}) = m \rightarrow Hc = Hc_{corr} + m \quad (6)$$

Hence, in some implementations $Hc_{corr}$ is added to m before coefficient estimation to equivalently generate a modified 'm' which reflects the entire non-linearity. This enables the estimator to estimate the complete non-linearity in signal 150. Using non-linearity corrector output signal as input to the coefficient estimation leads to a performance improvement due to reduction of second order effects. Other implementations also estimate residual coefficients from the residual non-linearity and add it to the currently programmed coefficients.

Figure 8:
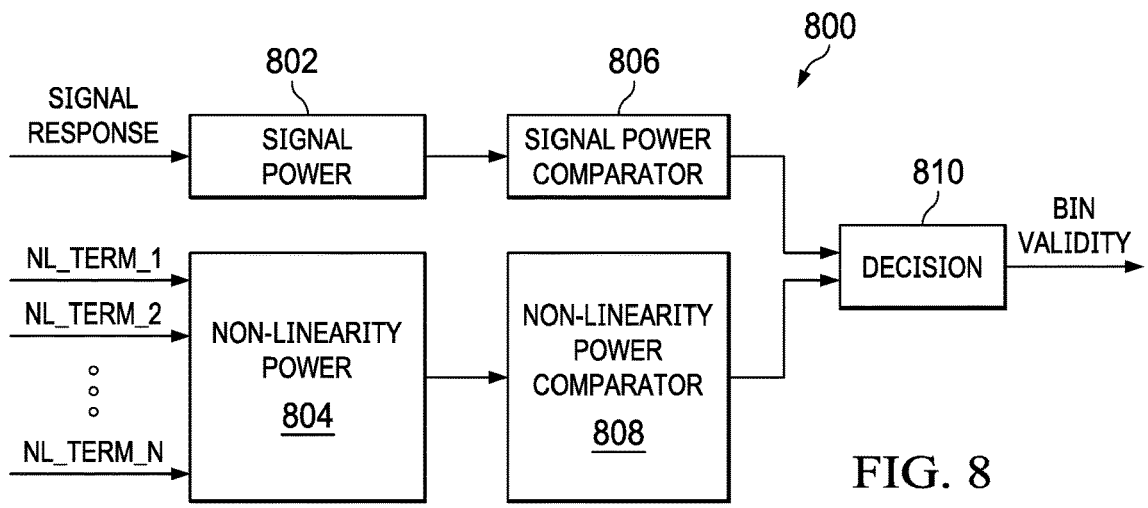
FIG. 8 depicts example an bin identification circuit, which may be implemented in the non-linearity correction circuitry shown in FIG. 7.

FIG. 8 depicts an example bin identification circuit 800, which may be implemented in the non-linearity coefficient estimator and tracker shown in FIG. 7, for instance implementing bin identification circuit 712. The bin identification circuit 800 includes a signal power circuit 802, a non-linearity term power circuit 804, a signal power comparator 806, a non-linearity term power comparator 808, and a decision circuit 810.

The signal power circuit 802 computes a value of signal power for each frequency bin of the frequency domain signal received from the time-to-frequency conversion circuit 710. Similarly, the non-linearity term power circuit 804 computes a value of non-linearity term power for each frequency bin of the frequency domain non-linearity terms received from the time-to-frequency conversion circuit 710. For a given frequency bin, the non-linearity term power circuit 804 computes the non-linearity term power as the sum of the squared magnitude or sum of magnitude of all non-linearity terms at the given frequency bin in some implementations. In other implementations, magnitude of a non-linearity term that exceeds a threshold is applied to compute non-linearity term power. In other implementations, magnitude of each non-linearity term's frequency response at a given bin is compared with a threshold and even if one of them crosses the threshold it is considered as passing the non-linearity power threshold.

For example let the non-linearity terms be $x^3[n]$, $x^2[n]x'[n]$, $x^2[n]x[n+1]$, $(x'[n])^3$, then one metric for determining high level of created non-linearity terms at a frequency bin is:

$$|F(x^3(n))|^2 + |F\left(x^2(n)x'(n)\right)|^2 + |F(x^2(n)x(n+1))|^2 + |F((x'[n])^3)|^2 > \text{NLThresh} \quad (7)$$

and one metric for determining low level of signal level at a frequency bin is:

$$|F(x(n))| < \text{SigThresh} \quad (8)$$

Both the conditions above should be met to select a frequency bin for estimation.

The signal power comparator 806 compares the frequency bin signal power values generated by the signal power circuit 802 to a signal power threshold. The non-linearity term power comparator 808 compares the frequency bin non-linearity term power values generated by the non-linearity term power circuit 804 to a non-linearity term power threshold. The decision circuit 810 identifies the frequency bins to be applied in non-linearity correction coefficient estimation based on the results of the comparisons performed by the signal power comparator 806 and the non-linearity term power comparator 808. Frequency bins having a high non-linearity term power (e.g., power above the non-linearity term power threshold, NLThresh) and a low signal power (e.g., power below the signal power threshold, SigThresh) are selected for use in non-linearity correction coefficient estimation. Thus, the decision circuit 810 identifies frequency bins for which the signal power is less than the signal power threshold and the non-linearity term power is greater than the non-linearity term power threshold as suitable for use in non-linearity correction coefficient estimation.

In an example of bin identification circuit 800 operation for $x^3[n]$ or any third order non-linearity, with a single tone input at f, the frequency response of $x^3[n]$ is high at f and 3f. Signal level is high at the fundamental frequency f. The bin identification circuit 800 selects only the bins corresponding to 3f for use in non-linearity correction coefficient estimation.

In an example of bin identification circuit 800 operation for $x^2[n]$ or any second order non-linearity, with a single tone input at f, the frequency response of $x^2[n]$ is high at 0 and 2f. Signal level is high at the fundamental frequency f. The bin identification circuit 800 selects only the bins corresponding to 0 and 2f for use in non-linearity correction coefficient estimation.

In an example of bin identification circuit 800 operation for $x^2[n]$ or any second order non-linearity, with two tone inputs at f1 and f2, the frequency response of $x^2[n]$ is high at 0, f2−f1, 2f1, f1+f2, and 2f2. The bin identification circuit 800 selects only the bins corresponding to 0, f2−f1, 2f1, f1+f2, and 2f2 for use in non-linearity correction coefficient estimation.

In an example of bin identification circuit 800 operation for a combination of second and third order non-linearity terms, with a single tone input at f, the bin identification circuit 800 selects only the bins corresponding to 0, 2f, and 3f for use in non-linearity correction coefficient estimation.

In an example of bin identification circuit 800 operation for a combination of second and third order non-linearity terms, with two tone inputs f1 and f2, the bin identification circuit 800 selects both the second order bins (0, f2−f1, 2f1, f1+f2, and 2f2) and the third order bins (2f1−f2, 2f2−f1, 2f1+f2, 3f1, 3f2, 2f2+f1) excluding the fundamental bins f1 and f2.

Figure 9A:
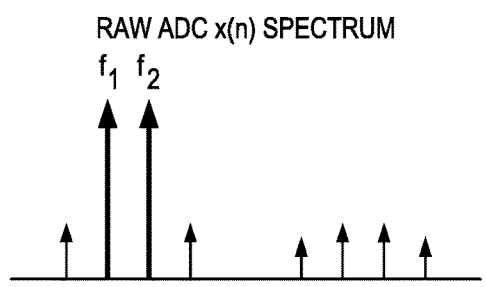
FIGS. 9A, 9B, and 9C depict example bin identification for use in non-linearity coefficient generation.
Figure 9B:
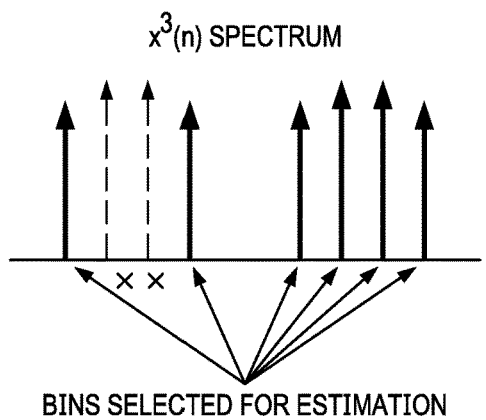
Figure 9C:
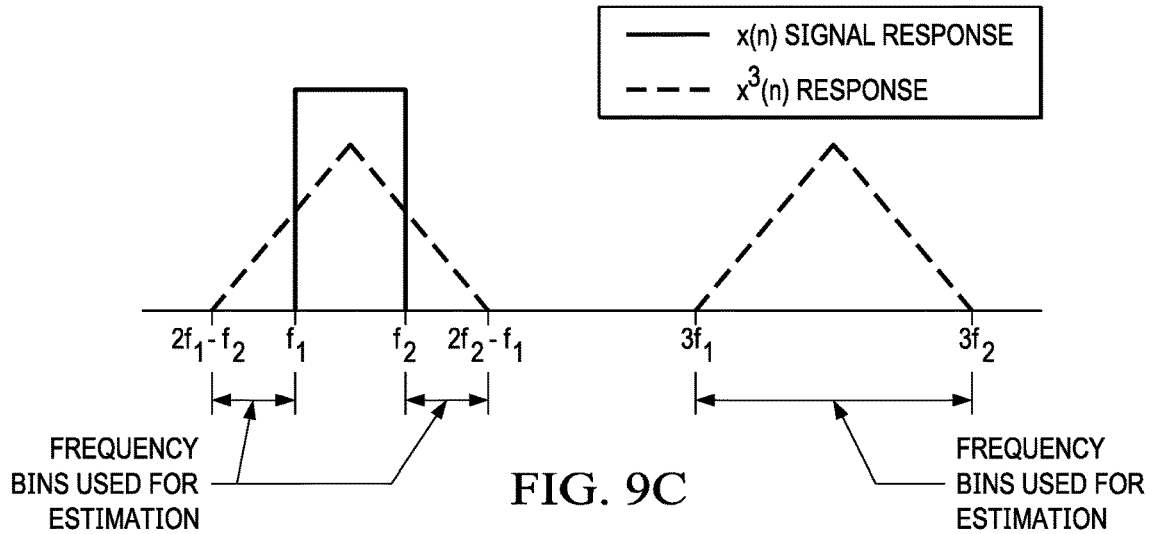

FIGS. 9A, 9B, and 9C depict example bin identification in the bin identification circuit 712. FIG. 9A shows the signal power for a two tone input with frequencies $f_1$ and $f_2$. For this input signal, the third order non-linearity term ($x^3$) or any other third order non-linearity term has eight components at $2f_1-f_2$, $f_1$, $f_2$, $2f_2-f_1$, $2f_1+f_2$, $3f_1$, $3f_2$, and $2f_2+f_1$. Based on comparison of the signal and non-linearity term to the respective power thresholds, the frequency bins at $2f_1-f_2$, $2f_2-f_1$, $2f_1+f_2$, $3f_1$, $3f_2$, and $2f_2+f_1$, as illustrated by FIG. 9B, are selected by the bin identification circuit 800 for use in non-linearity correction coefficient estimation.

While single and two-tone examples have been provided herein to describe operation of the bin identification circuit 800, in practice, the input signal is narrow or wide-band modulated data. FIG. 9C shows an example bin identification for wide band data occupying a band from f1 to f2. The regions selected for estimation of third order non-linearity terms are (2f1–f2 to f1), (f2 to 2f2–f1), and (3f1 to 3f2). The regions selected for estimation of second order terms are (0 to f2–f1) and (2f1 to 2f2). These regions can be aliased back to specific frequencies based on the sampling rate of the ADC 114. In some cases, if the aliased frequencies fall back into the signal band, then those frequency bins are used since they will fail the signal power check.

Figure 10:
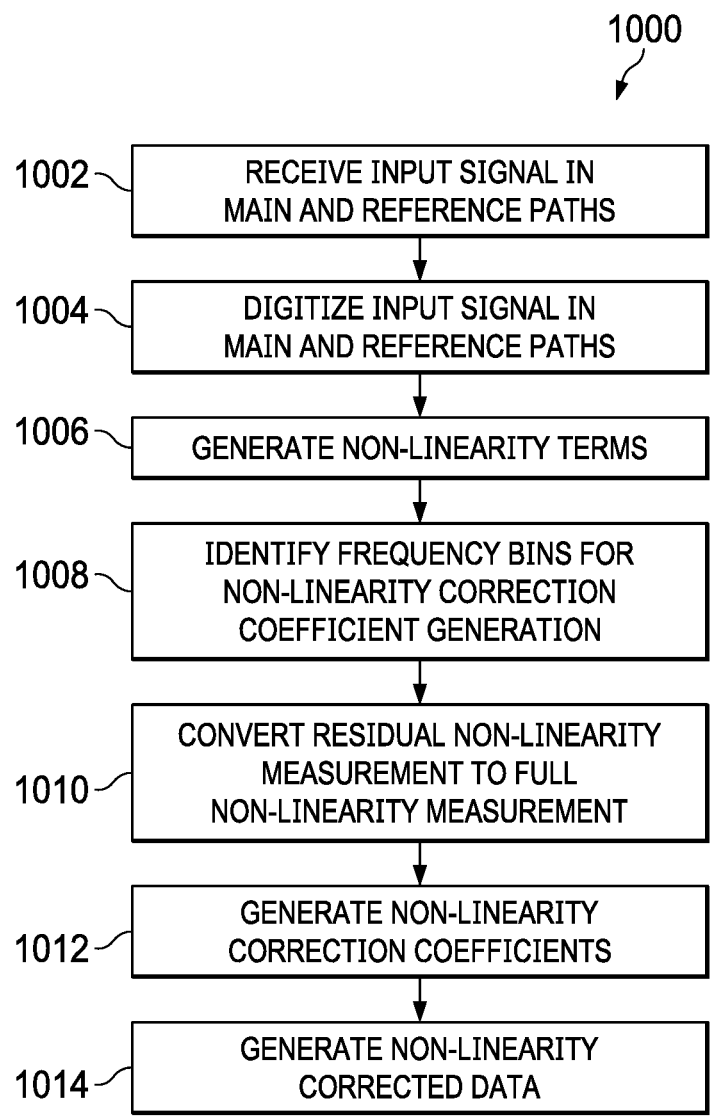
FIG. 10 depicts a flow diagram illustrating an example method for non-linearity correction, which may be performed by the non-linearity correction circuitry shown in FIGS. 1 and 7.

FIG. 10 depicts a flow diagram illustrating an example method 1000 for non-linearity correction, which may be performed by the non-linearity correction circuitry shown in FIGS. 1 and 7. Though depicted sequentially as a matter of convenience, at least some of the actions shown can be performed in a different order and/or performed in parallel. Additionally, some implementations may perform only some of the actions shown. Operations of the method 1000 are performed by implementations of the non-linearity correction circuit 700.

In block 1002, the non-linearity correction circuit 700 receives a signal as input to the DSA 112 and the ADC 114. For example, an input signal is provided at the input of the DSA circuit 112.

In block 1004, the ADC 114 digitizes the input signal. The data capture circuit 706 captures output of the ADC 114. In some implementations of the method 1000, the data capture circuit 706 selectably captures the output of the ADC 114, or the output of the non-linearity corrector 116 for use as estimation input data.

In block 1006, the non-linearity term generation circuit 708 processes the captured data and generates non-linearity terms for the captured data. The time-to-frequency conversion circuit 710 converts the data captured by the data capture circuit 706 and the non-linearity terms generated by the non-linearity term generation circuit 708 from time-domain to frequency-domain.

In block 1008, the bin identification circuit 712, identifies frequency bins to apply in estimation of the non-linearity correction coefficients. The identified frequency bins are frequency bins having signal power below a first threshold and non-linearity power above a second threshold.

In block 1010, the residual non-linearity conversion circuit 714 converts residual non-linearity measurement to full non-linearity measurement by modifying the frequency response of signal at the identified frequency bins. The frequency response is modified by adding a plurality of correction terms to the signal, where each correction term is a product of frequency response of the non-linearity terms with corresponding non-linearity correction coefficients currently used in the non-linearity corrector 116.

In block 1012, the non-linearity coefficient generation circuit 716 generates and tracks non-linearity correction coefficients based on the signal and non-linearity terms at the frequency bins identified by the bin identification circuit 712.

In block 1014, the non-linearity corrector 116 applies the non-linearity correction coefficients to compensate the non-linearity corrected data 154 for the non-linearities introduced in the digital signal 150 by the main path.

Figure 11:
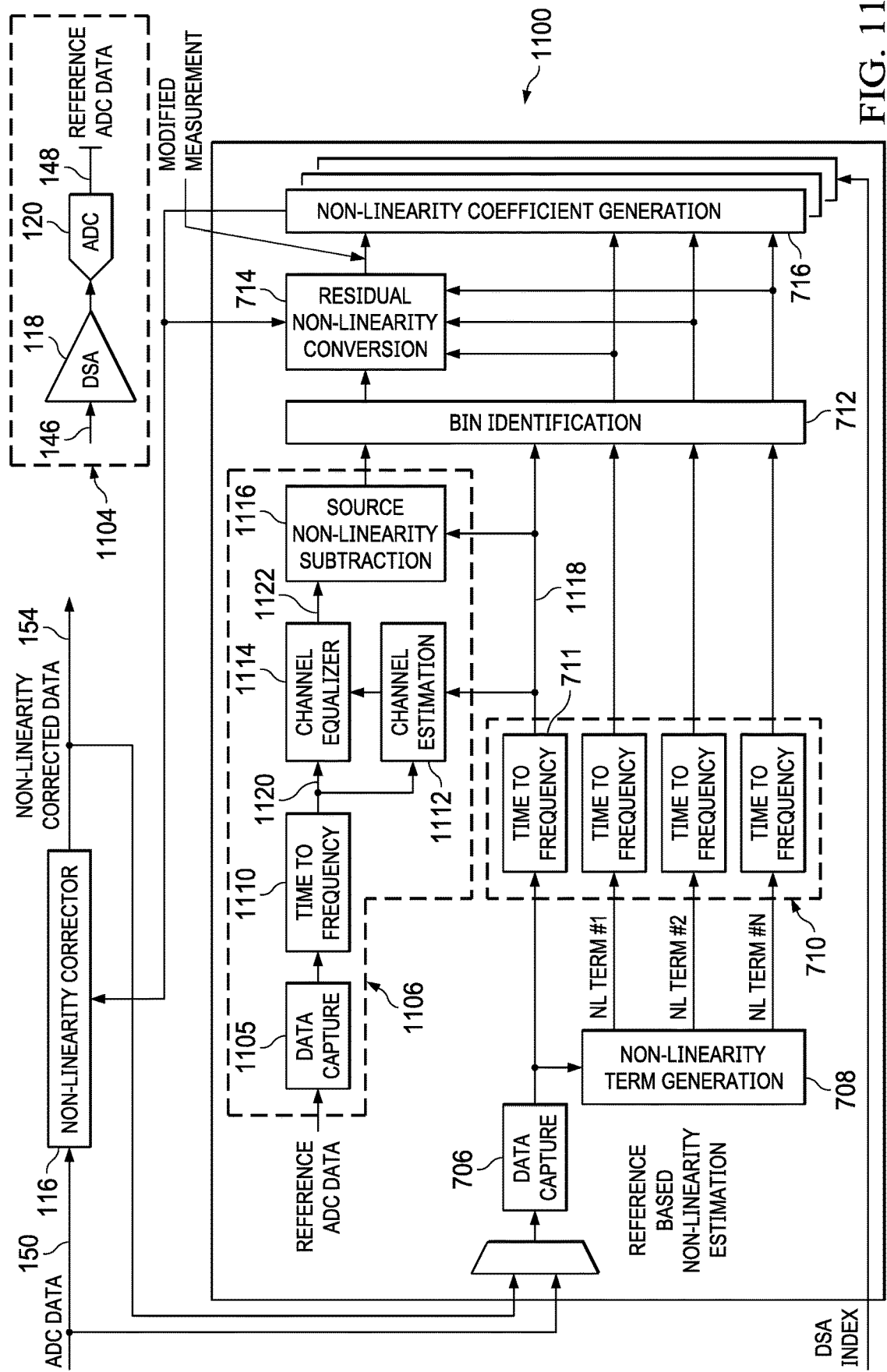
FIG. 11 depicts example non-linearity correction circuitry that estimates non-linearity correction coefficients using digital signals output from both the data signal path and the reference path, to facilitate non-linearity correction, which may be implemented in the non-linearity correction circuitry shown in FIGS. 1 and 3.

FIG. 11 depicts an example non-linearity correction circuitry that uses digital signals output from both the data signal path and the reference path, to facilitate non-linearity correction, which may be implemented in the non-linearity correction circuitry shown in FIGS. 1 and 3. FIG. 11 shows a block diagram for a non-linearity correction circuit 1100 that includes a reference data path 1104 that prevents the non-linearity correction circuit 1100 from compensating for input signal non-linearity by subtracting the input signal from the signal used to generate non-linearity correction coefficients.

The non-linearity correction circuit 1100 includes the reference path 1104 having a DSA circuit 118, an ADC 120, a data capture circuit 1108, a time-to-frequency conversion circuit 1110, a channel estimation circuit 1112, a channel equalization circuit 1114, and a source non-linearity subtraction circuit 1116. The DSA circuit 118 includes an input coupled to an input of the DSA circuit 112, and an output coupled to an input of the ADC 120. The reference path 1104 is more linear than the data path (main data path) formed by the DSA 112 and the ADC 114. For instance, the ADC 120 is more linear but possibly noisier than the ADC 114. The ADC 114 and the ADC 118 digitize the input signal 146.

The non-linearity correction circuit also includes a data capture circuit 706, a non-linearity term generation circuit 708, a time-to-frequency conversion circuit 710, a bin identification circuit 712, a residual non-linearity conversion circuit 714, and a non-linearity coefficient generation circuit 716. In an example, these components are implemented similarly to the components in FIG. 7 having the same reference numbers.

The data capture circuit 1108 is coupled to the output of the ADC 120 to capture data samples. The time-to-frequency conversion circuit 1110 is coupled to the data capture circuit 1108. The samples captured by capture circuit 1108 are provided to the time-to-frequency conversion circuit 1110. The time-to-frequency conversion circuit 1110 converts the time domain captured samples of the ADC 120 to frequency domain output signals 1120. For example, the time-to-frequency conversion circuit 1110 applies an FFT to the captured output signals received from the data capture 1108 to generate the frequency domain output signals 1120.

The time-to-frequency conversion circuit 1110 is coupled to the channel estimation circuit 1112. The channel estimation circuit 1112 receives the frequency domain signals 1120 generated by the time-to-frequency conversion circuit 1110 and the frequency domain signals 1118 generated by the time-to-frequency conversion circuit 711 and estimates a channel of the data path formed by the DSA 112 and the ADC 114 relative to the reference path of the DSA 118 and the ADC 120. The channel estimation circuit 1112 is coupled to the channel equalization circuit 1114. The channel equalization circuit 1114 receives channel estimates from the channel estimation circuit 1112 and applies the channel estimates to equalize the frequency domain output signal 1120.

The channel equalization circuit 1114 is coupled to the source non-linearity subtraction circuit 1116. The source non-linearity subtraction circuit 1116 receives the frequency domain output signal 1118 and the equalized output signal 1122 generated by the channel equalization circuit 1114. The source non-linearity subtraction circuit 1116 subtracts the equalized output signal 1122 from the frequency domain output signal 1118 to effectively remove the input signal 146 from the signal provided to the bin identification circuit 712. Thus, the output of the source non-linearity subtraction circuit effectively contains the non-linearity introduced by ADC 114 and DSA 112. The source non-linearity subtraction circuit 1116 is coupled to the bin identification circuit 712 and provides frequency domain output signal 1118 less the equalized output signal 1122 to the bin identification circuit 712 for use in determining non-linearity correction coefficients. In systems that include the reference path, some implementations of the non-linearity estimation circuit 1100 omit checking for low signal power in the bin identification circuit 800 because the fundamental signal has been removed from the signal processed by the non-linearity correction circuit 116.

In practice, circuit components of the main data path and the reference path are not well matched. For example, there are gain, delay, and/or bandwidth mismatches between the main data path and the reference path. The mismatches vary with the settings of the digital step attenuator in some implementations. To compensate for such mismatches, the output of a reference ADC (an ADC in the reference path) is fed to a channel equalizer before being used for signal subtraction. The channel equalizer matches the two data paths for precise cancellation of input signal and source non-linearity. The following non-linearity estimation equation is used for estimation at each identified bin:

$$\Rightarrow c_1 F(x^3[n]) + c_2 F(x^2[n]x'[n]) + c_3 F(x^2[n]) + c_4 F(x[n]x'[n]) = -\left(F(x[n]) - Ch^* F(x_{ref}[n])\right) - F(\text{noise}) \quad (9)$$

Once the reference path is matched to the main path, the output of the reference path effectively represents the input to the ADC and DSA circuit. When subtracted from output of the ADC 114 what is left are components introduced by ADC and DSA non-linearity and noise. This is what is represented by the right side of equation (9). Note that the reference path can be noisy and the effect of noise on estimation can be minimized by averaging over time.

Ch models frequency dependent mismatch between the paths. The subtraction of $Ch^*F(x_{ref}(n))$ cancels out all of the ADC input present at the selected bins, and, as a result, only non-linearity components of the ADC 114 and DSA 112 remain after cancellation.

Figure 12:
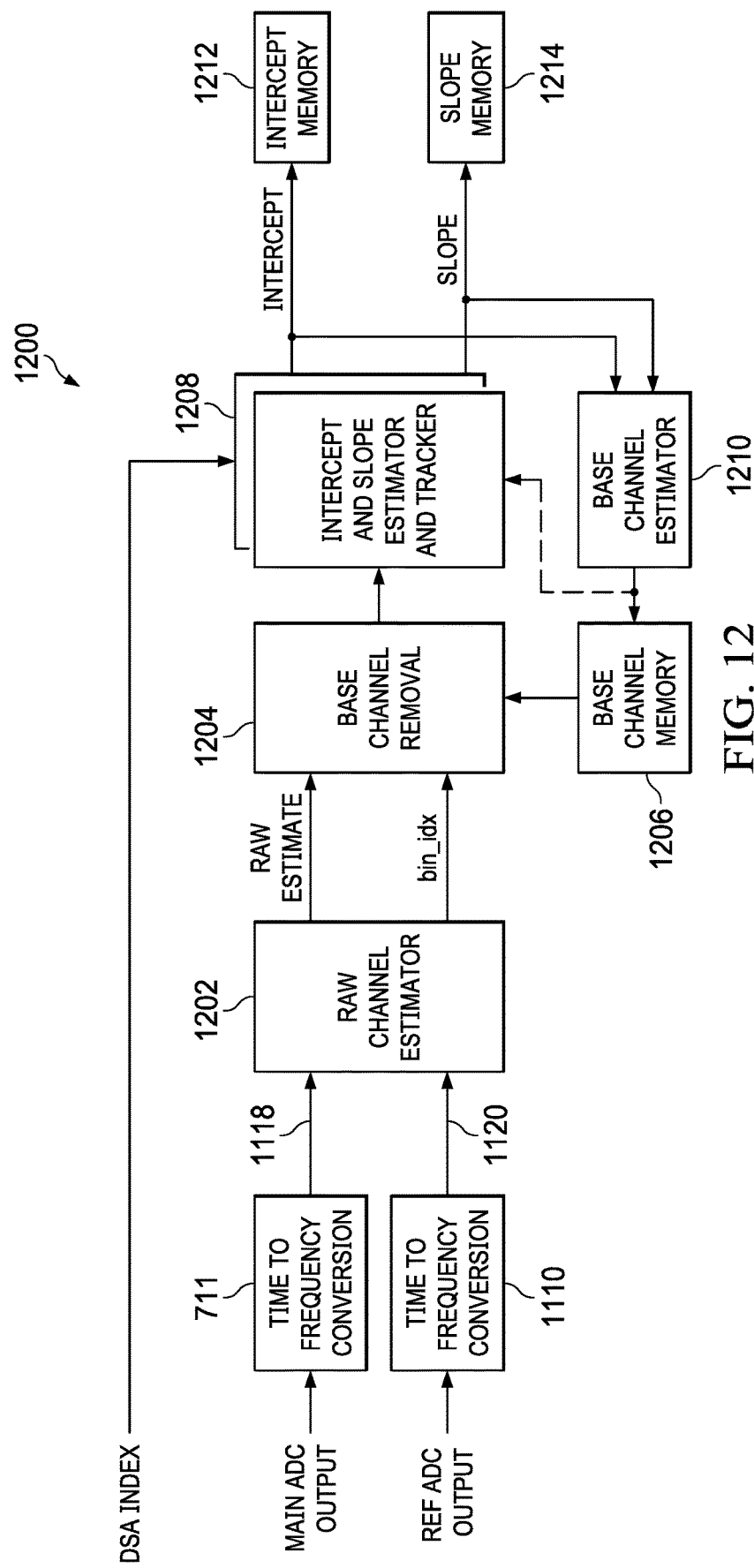
FIG. 12 depicts an example channel estimation circuit, which may be implemented in the non-linearity correction circuitry shown in FIG. 11.

FIG. 12 depicts an example channel estimation circuit 1200, which may be implemented in the non-linearity coefficient estimator and tracker shown in FIG. 11. FIG. 12 shows a block diagram for a channel estimation circuit 1200 suitable for use in the reference path 1104. The channel estimation circuit 1200 is an implementation of the channel estimation circuit 1112. The channel estimation circuit 1200 includes a raw channel estimation circuit 1202, a base channel removal circuit 1204, base channel memory 1206, a slope and intercept estimation circuit 1208, a base channel estimator 1210, an intercept memory 1212, and a slope memory 1214. The raw channel estimation circuit 1202 receives the frequency domain output signal 1118 and the frequency domain output signal 1120 and provides a raw channel estimate value for each frequency bin by correlating main path frequency domain response with reference frequency domain response at each bin. The raw channel estimate is, for example, obtained as shown in equation (10). The raw inverse channel estimate is a ratio of accumulated cross correlation of frequency responses of main and reference paths to accumulated power of main path response for a given frequency bin.

$$\text{Inverse\_H}_{ch}(f) = \frac{\sum X(f) X_{ref}^*(f)}{\sum |X(f)|^2} \quad (10)$$

$$H_{ch}(f) = 1 / \text{Inverse\_H}_{ch}(f)$$

The base channel removal circuit 1204 is coupled to the raw channel estimation circuit 1202 and the base channel memory 1206. The base channel memory 1206 provides base channel values to the base channel removal circuit 1204 for use in adjustment of the raw channel values. The base channel removal circuit 1204 receives the raw channel estimates generated by the raw channel estimation circuit 1202 and adjusts each raw channel estimate to remove a base channel estimate value. With the raw channel estimates and the bin locations for the estimates at a given DSA setting, the base channel removal circuit 1204 compensates the base channel response contribution from the raw channel estimates at the bin locations.

The slope and intercept estimation circuit 1208 is coupled to the base channel memory 1206. The slope and intercept estimation circuit 1208 processes the adjusted channel value received from the base channel removal circuit 1204 to estimate and track a slope value and an intercept value for each DSA setting. The slope and intercept estimation circuit 1208 is coupled to the intercept memory 1212 and the slope memory 1214. The slope and intercept estimation circuit 1208 stores intercept values in the intercept memory 1212 and stores slope values in the slope memory 1214.

The base channel estimator 1210 is coupled to the intercept memory 1212 and the slope memory 1214. The base channel estimator 1210 estimates base channel values using the slope and intercept values respectively stored in the slope memory 1214 and the intercept memory 1212. The base channel values model the frequency dependent common mismatch across different DSA settings, while the slope and intercept values model the small residual mismatch for each DSA setting. The base channel estimator 1210 is coupled to the base channel memory 1206, and stores the base channel values in the base channel memory 1206. The base channel estimator 1210 computes gain and delay mismatches for each DSA setting using the corresponding intercept and slope values. If a common gain and/or delay component is identified across all DSA settings, the base channel estimator 1210 applies the common part of the mismatch to refine the base channel response. The refined base channel response is stored in the base channel memory 1206. Given the refined base channel response, the previously estimated intercept and slope parameters are adjusted across all DSA settings to reflect only the residual mismatch. The adjusted slope and intercept values are stored in the slope memory 1214 and the intercept memory 1212 respectively.

Once we know a common gain or delay mismatch across all the DSA settings is established, then the base channel is updated as:

$$\text{new\_base\_ch}[\text{bin}] = \text{old\_base\_ch}[\text{bin}] * g_{mm} * e^{-j*2*pi*\frac{bin}{N_{FFT}}*d_{mm}} \quad (11)$$

where:

bin is a particular frequency bin location, and bin ranges from $0, 1, \ldots, N_{FFT}-1$;

$g_{mm}$ is common gain mismatch across all the DSA settings;

$d_{mm}$ is common delay mismatch across all the DSA setting; and $N_{FFT}$ is size of FFT used for time-to-frequency conversion.

old_bases_ch is unity at start in some implementations.

When the base channel has been updated, the intercept and slope are updated for each DSA setting as follows:

channel[bin][DSA]=old_base_ch[bin]*(old_Intercept [DSA]+bin*old_slope[DSA])=new_base_ ch[bin]*(new_Intercept[DSA]+bin*new_slope [DSA]) (12)

Equation (12) is applied at two bin locations for each DSA index. For example, at bin=10 and 100. Then, both the linear equations are solved to derive new intercept and new slope values for each DSA index.

Figure 13:
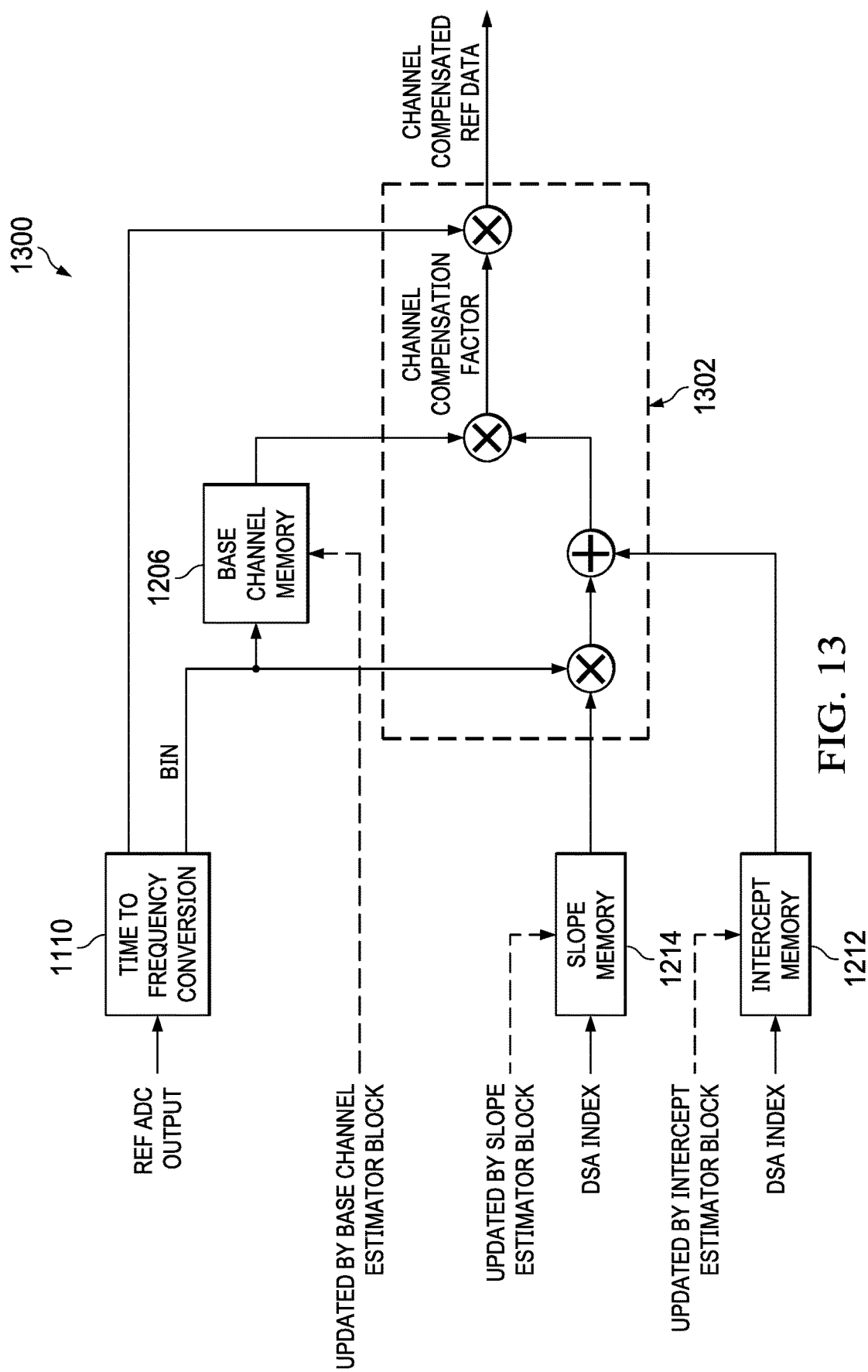
FIG. 13 depicts an example channel equalization circuit, which may be implemented in the non-linearity correction circuitry shown in FIG. 11.

FIG. 13 depicts an example channel equalization circuit, which may be implemented in the non-linearity coefficient estimator and tracker shown in FIG. 11. FIG. 13 shows a block diagram for a channel equalization circuit 1300 suitable for use in the reference path 1104. The channel equalization circuit 1300 is an implementation of the channel equalization circuit 1114. The channel equalization circuit 1300 is coupled to the time-to-frequency conversion circuit 1110, the base channel memory 1206, the intercept memory 1212, and the slope memory 1214. The channel equalization circuit 1300 includes a computation circuit 1302 that computes a channel compensation value (a channel equalization value) for each frequency bin and applies the channel compensation value to the frequency domain reference data for each frequency bin to equalize the reference path 1104. The computation circuit 1302 of the channel equalization circuit 1300 computes the channel compensation value as:

$$\text{Channel[DSA][Bin]}=\text{BaseChannel[Bin]}*(C_{Intercept}[\text{DSA}]+C_{Slope}[\text{DSA}]*\text{Bin}) \quad (13)$$

where:
Channel is a channel compensation value;
DSA is an attenuation selection index (a DSA index value) applied in the DSA circuit 112;
Bin is a frequency bin index;
BaseChannel is a base channel value retrieved from the base channel memory 1206;
$C_{intercept}$ is an intercept value retrieved from the intercept memory 1212; and
$C_{slope}$ is a slope value retrieved from the slope memory 1214.

The channel equalization circuit 1300 computes an equalized data value a product of the channel compensation value and a value of the frequency domain output signal 1120 (a frequency domain data value). Implementations of the channel equalization circuit 1300 are compact in size (e.g., in a range of $\frac{1}{8}^{th}$ the size of other equalization circuits).

Figure 14:
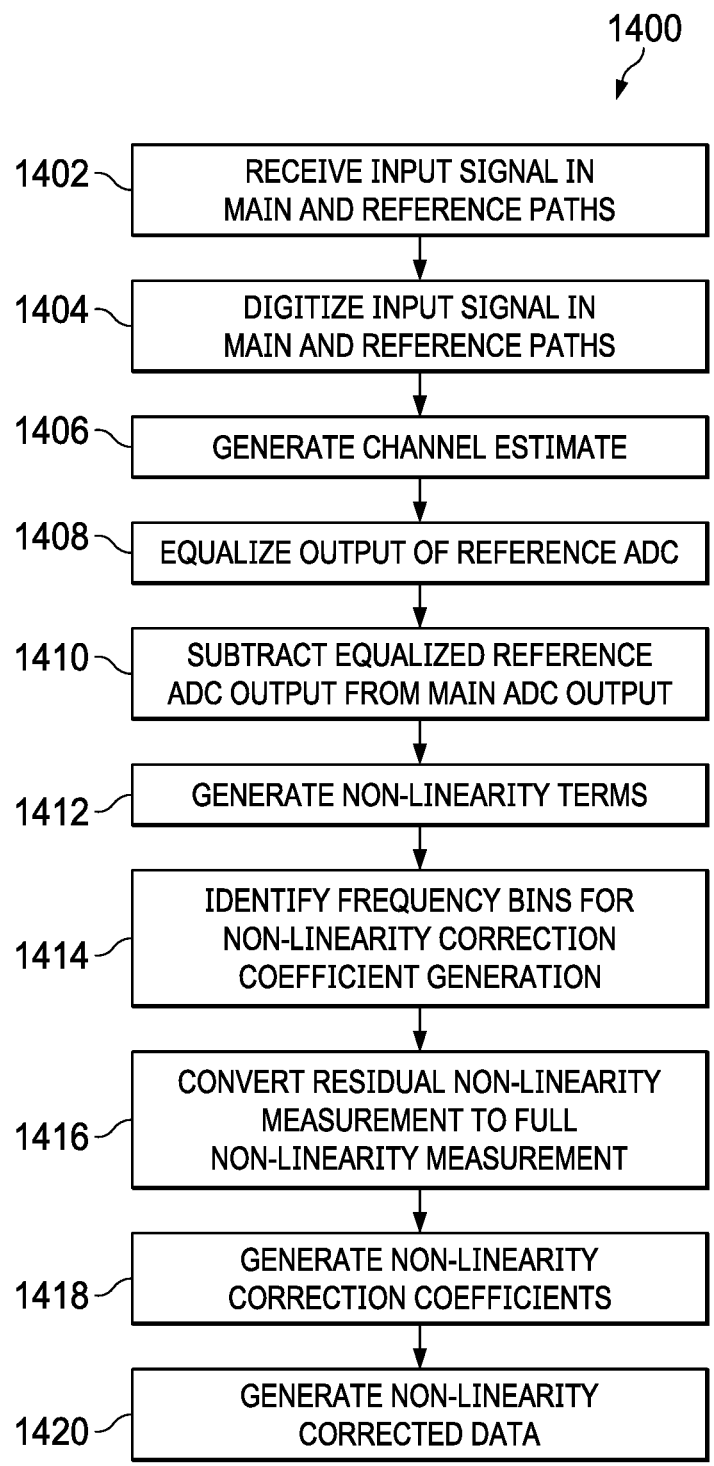
FIG. 14 depicts a flow diagram illustrating an example method for non-linearity correction, which may be performed by the non-linearity correction circuitry shown in FIGS. 1 and 11.

FIG. 14 depicts a flow diagram illustrating an example method 1400 for non-linearity correction, which may be performed by the non-linearity correction circuitry shown in FIGS. 1 and 11. Though depicted sequentially as a matter of convenience, at least some of the actions shown can be performed in a different order and/or performed in parallel. Additionally, some implementations may perform only some of the actions shown. Operations of the method 1400 are performed by implementations of the non-linearity correction circuit 1100.

In block 1402, the non-linearity correction circuit 1100 receives a signal as input to the DSA 112 of the main data path and the DSA 118 of the reference path 1104. The input signal includes non-linearity in some examples.

In block 1404, the ADC 114 digitizes the input signal in the main data path and the ADC 120 digitizes the input signal in the reference path 1104. The data capture circuit 706 captures output of the ADC 114, and the data capture circuit 1108 captures output of the ADC 120. In some implementations of the method 1400, the data capture circuit 706 selectably captures the output of the ADC 114 or the output of the non-linearity corrector circuit 116 for use as estimation input data. The time-to-frequency conversion circuit 711 converts the captured digital output of the ADC 114 from time domain to frequency domain, and the time-to-frequency conversion circuit 1110 converts the captured digital output of the ADC 120 from time domain to frequency domain.

In block 1406, the channel estimation circuit 1112 processes the frequency domain data provided by the time-to-frequency conversion circuits 1110 and 711 to generate a channel estimate for the reference path 1104 relative to the main data path.

In block 1408, the channel equalization circuit 1114 applies the channel estimate generated by the channel estimation circuit 1112 to equalize the frequency domain output signal 1120.

In block 1410, the source non-linearity subtraction circuit 1116 subtracts the equalized output signal 1122 from the frequency domain output signal 1118, In block 1412, the non-linearity term generation circuit 708 processes the captured data and generates non-linearity terms for the data captured by data capture circuit 706. The time-to-frequency conversion circuit 710 converts the non-linearity terms generated by the non-linearity term generation circuit 708 from time-domain to frequency-domain.

In block 1414, the bin identification circuit 712, identifies frequency bins to apply in estimation of the non-linearity correction coefficients. The identified frequency bins are frequency bins having signal power below a first threshold and non-linearity power above a second threshold.

In block 1416, the residual non-linearity conversion circuit 714 converts residual non-linearity measurement to full non-linearity measurement by modifying the frequency response of signal at the identified frequency bins. The frequency response is modified by adding a plurality of correction terms to the signal, where each correction term is a product of frequency response of the non-linearity terms with corresponding non-linearity correction coefficients currently used in the non-linearity corrector circuit 116.

In block 1418, the non-linearity coefficient generation circuit 716 generates and tracks non-linearity correction coefficients based on the signal and non-linearity terms at the frequency bins identified by the bin identification circuit 712.

In block 1420, the non-linearity corrector circuit 116 applies the non-linearity correction coefficients to compensate the non-linearity corrected data 154 for the non-linearities introduced in the digital signal 150 by the main path.

The above examples are illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

What is claimed is:

1. A method for non-linearity correction comprising:
receiving a first output signal from circuitry that includes a first analog-to-digital converter;
receiving a second output signal from a second analog-to-digital converter;
generating second order non-linearity coefficients using the received first output signal without using the received second output signal;
generating third order non-linearity coefficients using both the received first and second output signals; and
applying, by a non-linearity corrector included in the circuitry, the second and third order non-linearity coefficients to compensate for non-linearity components in a digitized signal output from the first analog-to-digital converter to generate a corrected digitized signal.

2. The method of claim 1, wherein the first output signal is the digitized signal output from the first analog-to-digital converter.

3. The method of claim 1, wherein the first output signal is the corrected digitized signal.

4. The method of claim 1, wherein generating the second order non-linearity coefficients includes:
generating second and third order non-linearity terms;
jointly estimating the second order non-linearity coefficients and third order non-linearity coefficients using the second and third order non-linearity terms;
computing a decoupling measure for the second and third order non-linearity coefficients; and
selecting and providing the second order non-linearity coefficients based on the decoupling measure.

5. The method of claim 1, wherein generating the second order non-linearity coefficients includes:
generating only second order non-linearity terms; and
estimating the second order non-linearity coefficients using the second order non-linearity terms.

6. The method of claim 1, wherein generating the third order non-linearity coefficients includes:
generating second and third order non-linearity terms;
jointly estimating the third order non-linearity coefficients and second order non-linearity coefficients using the second and third order non-linearity terms;
computing a decoupling measure for the second and third order non-linearity coefficients; and
selecting and providing the third order non-linearity coefficients based on the decoupling measure.

7. The method of claim 1, wherein generating the third order non-linearity coefficients includes:
generating only third order non-linearity terms; and
estimating the third order non-linearity coefficients using the third order non-linearity terms.

8. The method of claim 1, wherein:
the non-linearity components include: source non-linearity components; and non-linearity components caused by the circuitry; and
the second and third order non-linearity coefficients are applied to compensate for the non-linearity components caused by the circuitry without compensating for the source non-linearity components.

9. The method of claim 8, wherein the second order non-linearity coefficients are applied to compensate for second order non-linearity components caused by board circuitry and the first analog-to-digital converter included in the circuitry, and the third order non-linearity coefficients are applied to compensate for third order non-linearity components caused by the first analog-to-digital converter.

10. The method of claim 1, wherein generating the third order non-linearity coefficients using the first and second output signals includes:
generating first frequency domain data from the first output signal;
generating second frequency domain data from the second output signal;
subtracting the second frequency domain data from the first frequency domain data to remove: a source input signal having source non-linearity components; and non-linearity components caused by board circuitry, to generate third frequency domain data; and
estimating the second non-linearity coefficients using the third frequency domain data.

11. An apparatus comprising:
a non-linearity coefficient generator configured to:
receive a first digitized signal and a second digitized signal;
process the received first digitized signal, without processing the received second digitized signal, to generate second order non-linearity coefficients; and
process both the received first digitized signal and the received second digitized signal to generate third order non-linearity coefficients; and
a non-linearity corrector coupled to the non-linearity coefficient generator, the non-linearity corrector configured to generate a corrected digitized signal by applying the second and third order non-linearity coefficients to correct non-linearity components in a digitized signal at an output of an analog-to-digital converter.

12. The apparatus of claim 11, wherein the non-linearity coefficient generator is configured to process the digitized signal output from an analog-to-digital converter as the first digitized signal.

13. The apparatus of claim 11, wherein the non-linearity coefficient generator is configured to process the corrected digitized signal as the first digitized signal.

14. The apparatus of claim 11, wherein the non-linearity coefficient generator is configured to process the first and second digitized signals to generate the third order non-linearity coefficients by being configured to:
generate first frequency domain data from the first digitized signal;
generate second frequency domain data from the second digitized signal;
subtract the second frequency domain data from the first frequency domain data to remove a source input signal having source non-linearity components and non-linearity components caused by board circuitry to generate third frequency domain data; and
estimate the third order non-linearity coefficients using the third frequency domain data.

15. The apparatus of claim 11, wherein the non-linearity coefficient generator is configured to process the first digitized signal to generate the second order non-linearity coefficients by being configured to:
generate second and third order non-linearity terms;
jointly estimate the second order non-linearity coefficients and third order non-linearity coefficients using the second and third order non-linearity terms;
compute a decoupling measure for the second and third order non-linearity coefficients; and
select and provide the second order non-linearity coefficients based on the decoupling measure.

16. The apparatus of claim 11, wherein the non-linearity coefficient generator is configured to process the first and second digitized signals to generate the third order non-linearity coefficients by being configured to:
generate second and third order non-linearity terms;
jointly estimate the third order non-linearity coefficients and second order non-linearity coefficients using the second and third order non-linearity terms;
compute a decoupling measure for the second and third order non-linearity coefficients; and
select and provide the third order non-linearity coefficients based on the decoupling measure.

17. The apparatus of claim 11, wherein the non-linearity generator is configured to generate the second and third or non-linearity coefficients such that when applied, to the digitized signal at the output of the analog-to-digital converter, source non-linearity components at an input of the analog-to-digital converter remain in the corrected digitized signal.

18. An apparatus comprising:
first circuitry including:
  a first analog-to-digital converter (ADC) having a first ADC input and a first ADC output; and
  a non-linearity corrector having a first non-linearity corrector input coupled to the first ADC output and having a second non-linearity corrector input;
second circuitry including a second ADC having a second ADC input and a second ADC output; and
a non-linearity coefficient generator having a first input coupled to the first circuitry, a second input coupled to the second ADC output, and an output coupled to the second non-linearity corrector input, wherein the non-linearity coefficient generator is configured to:
  receive a first digitized signal from the first circuitry;
  receive a second digitized signal from the second ADC;
  generate second order non-linearity coefficients using the first digitized signal;
  generate third order non-linearity coefficients using the first and second digitized signals; and
  provide the second and third order non-linearity coefficients to the non-linearity corrector.

19. The apparatus of claim 18, wherein the first circuitry further includes a first digital step attenuator (DSA) having a first DSA input and a first DSA output coupled to the first ADC input, and the second circuitry further includes a second DSA having a second DSA input coupled to the first DSA input and having a second DSA output coupled to the second ADC input.

20. The apparatus of claim 19, further comprising board circuitry coupled to the first and second DSA inputs, and wherein the non-linearity coefficient generator is further configured to:
  generate first frequency domain data from the first digitized signal;
  generate second frequency domain data from the second digitized signal;
  subtract the second frequency domain data from the first frequency domain data to remove a source input signal having source non-linearity components and non-linearity components caused by the board circuitry to generate third frequency domain data; and
  estimate the third order non-linearity coefficients using the third frequency domain data.

21. The apparatus of claim 18, wherein the non-linearity coefficient generator is configured to generate second and third order non-linearity coefficients by being configured to:
  generate a first set of second and third order non-linearity terms using the first digitized signal;
  jointly estimate a first set of second and third order non-linearity coefficients using the first set of second and third order non-linearity terms;
  determine a first decoupling measure for the second and third order non-linearity coefficients;
  select and provide the second order non-linearity coefficients, to the non-linearity corrector, from the first set of second and third order non-linearity coefficients based on the first decoupling measure;
  generate a second set of second and third order non-linearity terms using the first digitized signal;
  jointly estimate a second set of second and third order non-linearity coefficients using the second set second and third order non-linearity terms and based on the second digitized signal;
  determine a second decoupling measure for the second and third order non-linearity coefficients; and
  select and provide the third order non-linearity coefficients, to the non-linearity corrector, from the second set of second and third order non-linearity coefficients based on the second decoupling measure.

22. The apparatus of claim 18, wherein the second ADC is more linear than the first ADC.

23. A method for non-linearity correction comprising:
  receiving a first output signal from circuitry that includes a first analog-to-digital converter;
  receiving a second output signal from a second analog-to-digital converter;
  generating second order non-linearity coefficients using the received first output signal without using the received second output signal;
  generating third order non-linearity coefficients using both the received first and second output signals; and
  applying, by a non-linearity corrector included in the circuitry, the second and third order non-linearity coefficients to compensate for non-linearity components in a digitized signal output from the first analog-to-digital converter to generate a corrected digitized signal, the non-linearity components including source non-linearity components and non-linearity components caused by the circuitry, in which the second and third order non-linearity coefficients are applied to compensate for the non-linearity components caused by the circuitry without compensating for the source non-linearity components.

24. A receiver circuit comprising:
printed circuit board (PCB) circuitry;
first circuitry including:
  a first digital step attenuator (DSA) having a first DSA input and a first DSA output, the first DSA input coupled to the PCB circuitry;
  a first analog-to-digital converter (ADC) having a first ADC input and a first ADC output, the first ADC input coupled to the first DSA output; and
  a non-linearity corrector having a first non-linearity corrector input coupled to the first ADC output and having a second non-linearity corrector input;
second circuitry including:
  a second DSA having a second DSA input and a second DSA output, the second DSA input coupled to the PCB circuitry; and
  a second ADC that is more linear than the first ADC, the second ADC having a second ADC input and a second ADC output, the second ADC input coupled to the second DSA output;
a non-linearity coefficient generator having a first input coupled to the first circuitry, a second input coupled to the second ADC output, and an output coupled to the second non-linearity corrector input, in which the non-linearity coefficient generator is configured to: receive a first digitized signal from the first circuitry; receive a second digitized signal from the second ADC;
generate second order non-linearity coefficients using the first digitized signal; generate third order non-linearity coefficients using the first and second digitized signals; and provide the second and third order non-linearity coefficients to the non-linearity corrector; and
  in which the non-linearity corrector is configured to: receive, from the first ADC, a digitized output signal including source non-linearity components, second order non-linearity components caused by the PCB circuitry and the first ADC, and third order non-linearity components caused by the first ADC; apply the second order non-linearity coefficients to compensate for the second order non-linearity components; apply the third order non-linearity coefficients to compensate for the third order non-linearity components; and generate a corrected digitized signal including the source non-linearity components.

* * * * *